US012757758B2

(12) United States Patent
Tseng et al.

(10) Patent No.: US 12,757,758 B2
(45) Date of Patent: *Oct. 6, 2026

(54) SEMICONDUCTOR PACKAGE AND MANUFACTURING METHOD OF SEMICONDUCTOR PACKAGE

(71) Applicant: Taiwan Semiconductor Manufacturing Company, Ltd., Hsinchu (TW)

(72) Inventors: Ying-Cheng Tseng, Tainan City (TW); Hao-Yi Tsai, Hsinchu City (TW); Yu-Chih Huang, Hsinchu (TW); Chia-Hung Liu, Hsinchu City (TW)

(73) Assignee: Taiwan Semiconductor Manufacturing Company, Ltd., Hsinchu (TW)

(*) Notice: Subject to any disclaimer, the term of this patent is extended or adjusted under 35 U.S.C. 154(b) by 146 days.

This patent is subject to a terminal disclaimer.

(21) Appl. No.: 18/179,395

(22) Filed: Mar. 7, 2023

(65) Prior Publication Data

US 2023/0207472 A1 Jun. 29, 2023

Related U.S. Application Data

(63) Continuation of application No. 16/884,035, filed on May 26, 2020, now Pat. No. 12,113,022.

(51) Int. Cl.

*H10W 70/60* (2026.01)
*H10F 39/90* (2026.01)
(Continued)

(52) U.S. Cl.

CPC ........ *H10W 70/611* (2026.01); *H10W 70/614* (2026.01); *H10W 70/65* (2026.01); (Continued)

(58) Field of Classification Search

CPC ............... H01L 25/167; H01L 25/0652; H01L 25/0655; H01L 25/105; H01L 23/5389; (Continued)

(56) References Cited

U.S. PATENT DOCUMENTS 8,993,380 B2 3/2015 Hou et al.
9,281,254 B2 3/2016 Yu et al.
(Continued)

*Primary Examiner* — Yu Chen
(74) *Attorney, Agent, or Firm* — JCIPRNET

(57) ABSTRACT

A semiconductor package includes a lower encapsulated semiconductor device, a lower redistribution structure, an upper encapsulated semiconductor device, and an upper redistribution structure. The lower redistribution structure is disposed over and electrically connected to the lower encapsulated semiconductor device. The upper encapsulated semiconductor device is disposed over the lower encapsulated semiconductor device and includes a sensor die having a pad and a sensing region, an upper encapsulating material at least laterally encapsulating the sensor die, and an upper conductive via extending through the upper encapsulating material and connected to the lower redistribution structure. The upper redistribution structure is disposed over the upper encapsulated semiconductor device. The upper redistribution structure covers the pad of the sensor die and has an opening located on the sensing region of the sensor die.

20 Claims, 19 Drawing Sheets

(51) Int. Cl.

| | |
|---|---|
| ***H10W 70/65*** | (2026.01) |
| ***H10W 70/685*** | (2026.01) |
| ***H10W 90/00*** | (2026.01) |
| ***H10W 90/22*** | (2026.01) |
| *H10W 72/00* | (2026.01) |
| *H10W 74/10* | (2026.01) |

(52) U.S. Cl.

CPC ......... *H10W 70/685* (2026.01); *H10W 90/00* (2026.01); *H10W 90/401* (2026.01); *H10F 39/90* (2025.01); *H10W 70/60* (2026.01); *H10W 72/823* (2026.01); *H10W 74/114* (2026.01); *H10W 90/22* (2026.01)

(58) Field of Classification Search

CPC ........ H10F 39/90; H10F 39/95; H10W 90/00; H10W 90/22; H10W 70/614

See application file for complete search history.

(56) References Cited

U.S. PATENT DOCUMENTS

| | | | | |
|---|---|---|---|---|
| 9,299,649 | B2 | 3/2016 | Chiu et al. | |
| 9,372,206 | B2 | 6/2016 | Wu et al. | |
| 9,425,126 | B2 | 8/2016 | Kuo et al. | |
| 9,443,783 | B2 | 9/2016 | Lin et al. | |
| 9,461,018 | B1 | 10/2016 | Tsai et al. | |
| 9,496,189 | B2 | 11/2016 | Yu et al. | |
| 9,666,502 | B2 | 5/2017 | Chen et al. | |
| 9,735,131 | B2 | 8/2017 | Su et al. | |
| 10,608,125 | B1 * | 3/2020 | Zhou | H01L 31/0203 |
| 12,113,022 | B2 * | 10/2024 | Tseng | H01L 23/5385 |
| 2010/0290191 | A1 * | 11/2010 | Lin | H01L 24/82 361/764 |
| 2018/0068938 | A1 * | 3/2018 | Yazdani | H01L 21/486 |
| 2019/0096866 | A1 * | 3/2019 | Hsu | H01L 23/3135 |
| 2021/0005761 | A1 * | 1/2021 | Tsai | H01L 25/162 |

* cited by examiner

SEMICONDUCTOR PACKAGE AND MANUFACTURING METHOD OF SEMICONDUCTOR PACKAGE

CROSS-REFERENCE TO RELATED APPLICATION

This application is a continuation application of and claims the priority benefit of a prior application Ser. No. 16/884,035, filed on May 26, 2020. The entirety of the above-mentioned patent application is hereby incorporated by reference herein and made a part of this specification.

BACKGROUND

The semiconductor industry has experienced rapid growth due to ongoing improvements in the integration density of a variety of electronic components (e.g., transistors, diodes, resistors, capacitors, etc.). For the most part, improvement in integration density has resulted from iterative reduction of minimum feature size, which allows more components to be integrated into a given area. As the demand for shrinking electronic devices has grown, a need for smaller and more creative packaging techniques of semiconductor dies has emerged. An example of such packaging systems is integrated fan-out (InFO) technology.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
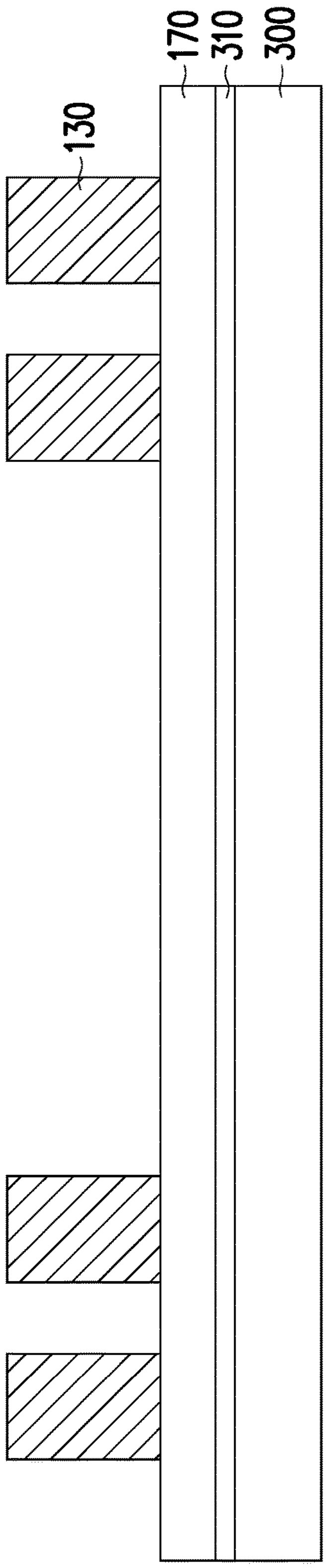
FIG. 1 to FIG. 14 illustrate cross sectional views of an intermediate stage in a manufacturing of a semiconductor package according to some exemplary embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In addition, terms, such as "first," "second," "third," "fourth," and the like, may be used herein for ease of description to describe similar or different element(s) or feature(s) as illustrated in the figures, and may be used interchangeably depending on the order of the presence or the contexts of the description.

FIG. 1 to FIG. 14 illustrate cross sectional views of an intermediate stage in a manufacturing of a semiconductor package according to some exemplary embodiments of the present disclosure. It is noted that the present disclosure will be described with respect to some embodiments in a specific context, namely a package on package structure. The concepts in the disclosure may also apply, however, to other semiconductor structures or circuits. In some embodiments, a semiconductor package is applicable for a package on package structure, wherein the upper package thereof is a sensor package. The intermediate stages of forming the package on package structure are illustrated in accordance with some embodiments. The variations of the embodiments are discussed. Throughout the various views and illustrative embodiments, like reference numbers are used to designate like elements.

Figure 14:
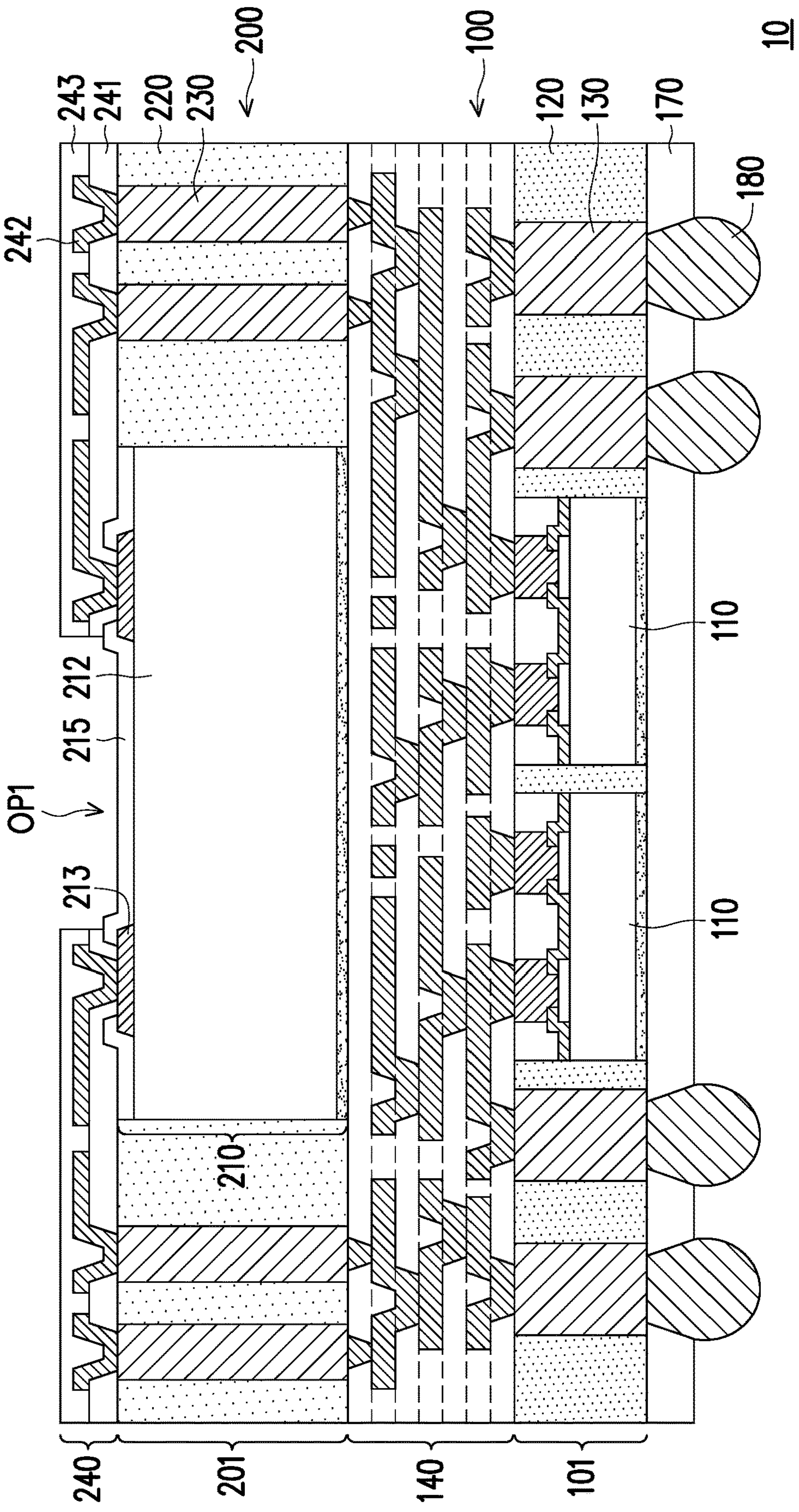

In some embodiments, the intermediate stages of forming the semiconductor package as shown in FIG. 14 are described as follows. With reference to FIG. 1, a carrier substrate 300 is provided, and an adhesive layer 310 may be disposed on the carrier substrate 300. In some embodiments, the carrier substrate 300 may include, for example, silicon based materials, such as glass, ceramics or silicon oxide, or other materials, such as aluminum oxide, combinations of any of these materials, or the like. The carrier substrate 300 is planar in order to accommodate an attachment of semiconductor dies such as semiconductor dies 110/110' (illustrated and discussed below with respect to FIG. 2 and FIG. 4). The carrier substrate 300 may be a wafer, such that multiple packages can be formed on the carrier substrate 300 simultaneously for mass production. The adhesive layer 310 may be placed on the carrier substrate 300 in order to assist in the adherence of overlying structures (e.g. dielectric layer 170). In an embodiment, the adhesive layer 310 may include an ultra-violet glue, which reduces or loses its adhesive properties when exposed to ultra-violet light. However, other types of adhesives, such as pressure sensitive adhesives, radiation curable adhesives, light to heat conversion release coating (LTHC), epoxies, combinations of these, or the like, may also be used. The adhesive layer 310 may be placed onto the carrier substrate 300 in a semi-liquid or gel form, which is readily deformable under pressure.

Figure 5:
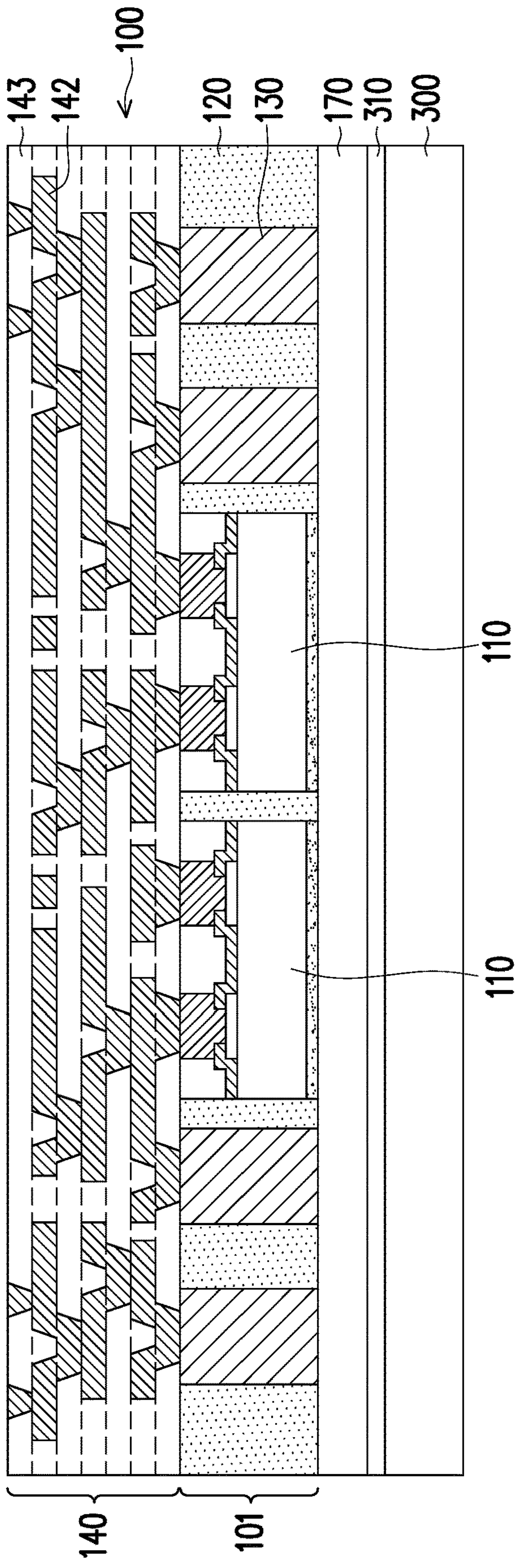

In some embodiments, a lower package (e.g. the lower fan-out tier 100 as shown in FIG. 5) may be formed on the carrier substrate 300. In some embodiments, the lower fan-out tier 100 is an integrated fan-out package, although any suitable packages may alternatively be used. In some embodiment, the lower fan-out tier 100 may be in a wafer form. In some embodiments, the lower fan-out tier 100 may include a plurality of semiconductor dies 110 encapsulated by an encapsulating material 120. The formation of the lower fan-out tier 100 may include the following steps.

With reference now to FIG. 1, n dielectric layer 170 may be optionally formed on the carrier substrate 300, or on the adhesive layer 310 (if any). In some embodiments, the insulating layer 170 may be placed over the adhesive layer 310 and is utilized in order to provide protection to, e.g., the semiconductor dies 110/110' once the semiconductor dies 110/110' have been attached. In an embodiment, the insulating layer 170 may be polybenzoxazole (PBO), although any suitable material, such as polyimide or a polyimide derivative, may alternatively be utilized. The insulating layer 170 may be placed using, e.g., a spin-coating process to a thickness of between about 2 μm and about 15 μm, such as about 5 μm, although any suitable method and thickness may alternatively be used.

Then, at least one lower conductive via 130 (multiple lower conductive vias 130 are illustrated, but not limited thereto) is provided on the carrier substrate 300, and the lower conductive vias 130 surrounds at least one die area where the semiconductor dies 110/110' to be disposed. In the present embodiment, the lower conductive vias 130 are formed on the carrier substrate 300, but the disclosure is not limited thereto. In other embodiments, the lower conductive vias 130 may be pre-formed, and are then placed on the carrier substrate 300.

In the embodiment of the lower conductive vias 130 formed on the carrier substrate 300, the formation of the lower conductive vias 130 may include the following steps. First, a seed layer may be formed over the carrier substrate 300. The seed layer is a thin layer of a conductive material that aids in the formation of a thicker layer during subsequent processing steps. The seed layer may be created using processes such as sputtering, evaporation, or PECVD processes, depending upon the desired materials.

Then, a photoresist is formed over the seed layer. In an embodiment, the photoresist may be placed on the seed layer using, e.g. a spin coating technique. Once in place, the photoresist may then be patterned by exposing the photoresist to a patterned energy source (e.g. a patterned light source), thereby inducing a physical change in those portions of the photoresist exposed to the patterned light source. A developer is then applied to the exposed photoresist to take advantage of the physical changes and selectively remove either the exposed portion of the photoresist or the unexposed portion of the photoresist, depending upon the desired pattern. The pattern formed into the photoresist is a pattern for the lower conductive vias 130. The lower conductive vias 130 are formed in such a placement as to be located on different sides of subsequently attached semiconductor dies 110/110'. In other words, the semiconductor dies 110/110' are surrounded by the lower conductive vias 130. However, any suitable arrangement for the pattern of lower conductive vias 130 may alternatively be utilized.

Then, the lower conductive vias 130 are formed in the photoresist. In an embodiment, the lower conductive vias 130 include one or more conductive materials, such as copper, tungsten, other conductive metals, or the like, and may be formed, for example, by electroplating, electroless plating, or the like. In an embodiment, an electroplating process is used for plating the exposed conductive areas of the seed layer within the opening of the photoresist. Once the lower conductive vias 130 are formed using the photoresist and the seed layer, the photoresist may be removed using a suitable removal process. In an embodiment, a plasma ashing process may be used to remove the photoresist, whereby the temperature of the photoresist 301 may be increased until the photoresist experiences a thermal decomposition and may be removed. However, any other suitable process, such as a wet strip, may alternatively be utilized. The removal of the photoresist may expose the underlying portions of the seed layer.

Then, the exposed portions of the seed layer (e.g., those portions that are not covered by the lower conductive vias 130) may be removed by, for example, a wet or dry etching process. For example, in a dry etching process reactants may be directed towards the seed layer, using the lower conductive vias 130 as masks. Alternatively, etchants may be sprayed or otherwise put into contact with the seed layer in order to remove the exposed portions of the seed layer. After the exposed portion of the seed layer has been etched away, a portion of the dielectric layer 170 is exposed between the lower conductive vias 130. At this point, the formation of the lower conductive vias 130 is substantially done.

Figure 2:
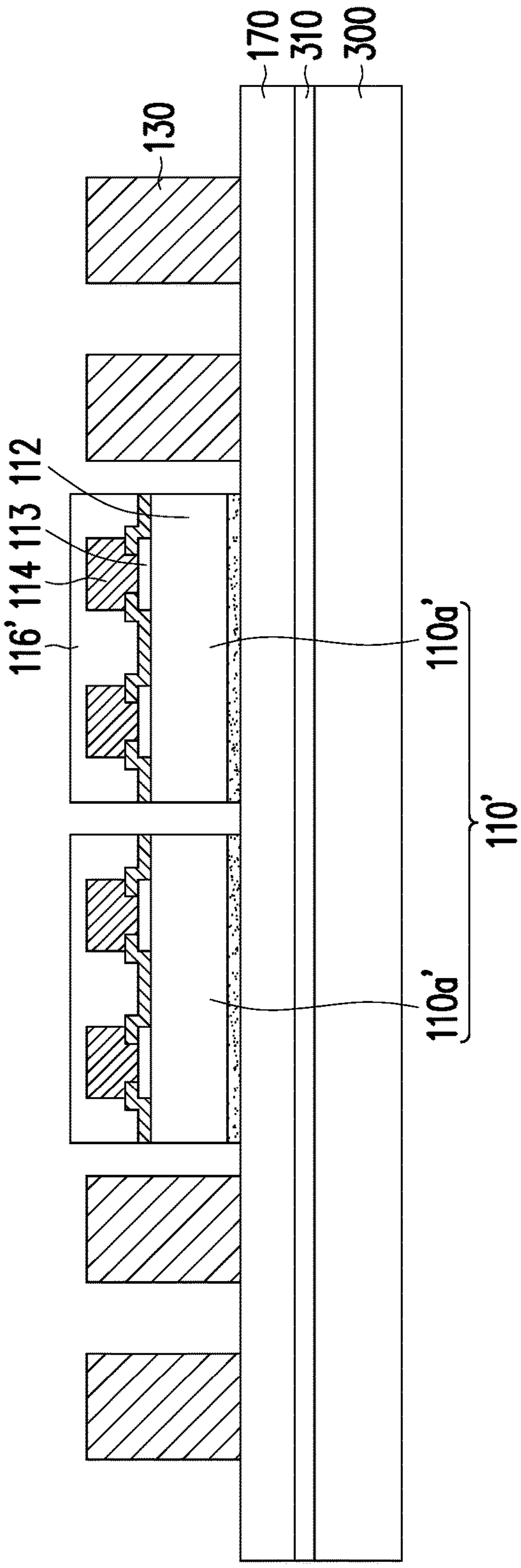

With reference now to FIG. 2, in some embodiments, at least one semiconductor die 110*a*', 110*b*' may be placed on the carrier substrate 300 and adjacent to (within or between) the lower conductive vias 130. In an embodiment, a semiconductor die set 110' may be provided on the carrier substrate 300, and the semiconductor die set 110' may include a first semiconductor die 110*a*' and a second semiconductor die 110*b*'. In some embodiments, the semiconductor dies 110*a*' and 110*b*' are arranged in a side by side manner. In some embodiments, the first semiconductor die 110*a*' and the second semiconductor die 110*b*' are electrically connected through, e.g., a lower redistribution structure 140 (illustrated and discussed below with respect to FIG. 5) and may be utilized together in order to provide a desired functionality to an end user. In an embodiment the first semiconductor die 110*a*' and the second semiconductor die 110*b*' may be attached to the carrier substrate 300 (or the dielectric layer 170) using, e.g. an adhesive material, although any suitable method of attachment may alternatively be utilized. The lower conductive vias 130 may surround the semiconductor die set 110'.

In some embodiments, the semiconductor dies 110' may include an application specific integrated circuit (ASIC), a digital signal processor (DSP), a dynamic random access memory (DRAM), a power management integrated circuit (PMIC), a logic die, a dummy die, or any combination thereof. For example, one of the semiconductor dies (e.g. the semiconductor die 110*a*') may be a logic die including logic circuits therein. In some exemplary embodiments, another one of the semiconductor dies (e.g. the semiconductor die 110*b*') may be a die that are designed for mobile applications, and may include an application specific integrated circuit (ASIC), a digital signal processor (DSP), a dynamic random access memory (DRAM), a power management integrated circuit (PMIC), for example. It is noted that more or less semiconductor dies 110' may be placed over the carrier substrate 300 and level with one another. In an alternative embodiment, single one semiconductor die 110*a*'/110*b*' may be disposed on the carrier substrate 300, and the semiconductor die 110*a*'/110*b*' may be a die that are designed for mobile applications, and may include an ASIC, a DSP, a DRAM, or any other suitable device dies. In some other embodiments, one of the semiconductor dies may be a dummy die, which may be configured for mechanical support or stress redistribution. The disclosure does not limit the types or functions of the semiconductor die(s) on the carrier substrate 300.

In some exemplary embodiments, each of the semiconductor dies 110' may include a substrate 112, at least one active device (not shown), at least one pad 113 (two pads 113 are illustrated in each die, but not limited thereto) 113, at least one dielectric layer 116', and at least one connector 114 (two connectors 114 are illustrated in each die, but not limited thereto) connected to the pad 113. The connectors 114 (such as copper vias) may be formed on an active surface (e.g. the top surface) of the semiconductor die 110' and electrically connected to the pads 113 on the substrate 112. The substrate 112 may include bulk silicon, doped or undoped, or an active layer of a silicon-on-insulator (SOI) substrate. Generally, an SOI substrate includes a layer of a semiconductor material such as silicon, germanium, silicon germanium, SOI, silicon germanium on insulator (SGOI), or combinations thereof. Other substrates that may be used include multi-layered substrates, gradient substrates, or hybrid orientation substrates. The active devices includes a wide variety of active devices and passive devices such as capacitors, resistors, inductors and the like that may be used to generate the desired structural and functional requirements of the design for the semiconductor dies 110'. The active devices may be formed using any suitable methods either within or else on the substrate 112.

In some embodiments, the dielectric layer 116' may be formed on the active surface of the semiconductor dies 110', and may cover the top surfaces of the connectors 114. In other embodiments, the top surface of the dielectric layer 116' may be substantially level with the top surfaces of the connectors 114. Alternatively, the dielectric layer 116' may be omitted, and the connectors 114 protrude from the active surface of the semiconductor dies 110'. The dielectric layer 116' may be made of one or more suitable dielectric materials such as silicon oxide, silicon nitride, low-k dielectrics such as carbon doped oxides, extremely low-k dielectrics such as porous carbon doped silicon dioxide, combinations of these, or the like. The dielectric layer 116' may be formed through a process such as chemical vapor deposition (CVD), although any suitable process may be utilized.

In some embodiments, the top ends of the lower conductive vias 130 may be substantially level with the top surfaces of the connectors 114. In other embodiments, the top ends of the lower conductive vias 130 may be substantially higher than the top surfaces of the connectors 114. Alternatively, the top ends of the lower conductive vias 130 may be substantially lower than the top surfaces of the connectors 114 but substantially higher than the bottom surfaces of the connectors 114.

Figure 3:
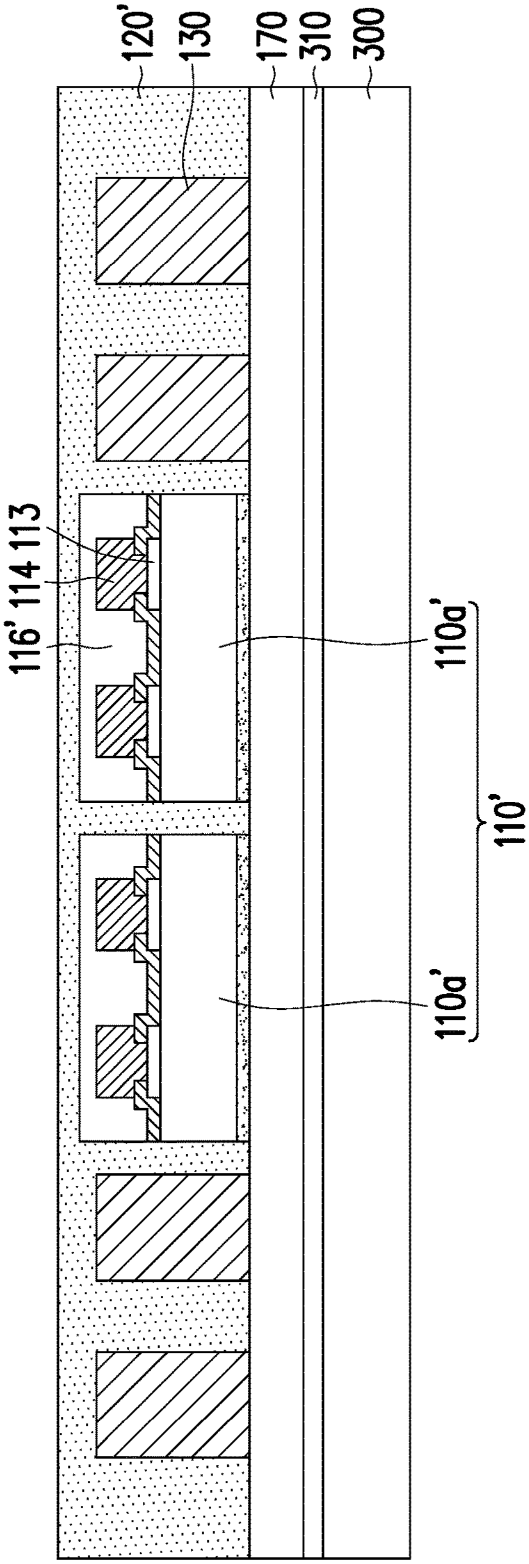

With reference now to FIG. 3, in some embodiments, the semiconductor dies 110' and the lower conductive vias 130 on the carrier substrate 300 are encapsulated by a (lower) encapsulating material 120'. In some embodiments, the lower encapsulating material 120' at least laterally encapsulates the semiconductor die set (e.g. the semiconductor dies 110*a*', 110*b*') and the lower conductive vias. In other words, the lower encapsulating material 120' is formed on the carrier substrate 300 to encapsulate the lower conductive vias 130 and the semiconductor dies 110'. In some embodiments, the lower encapsulating material 120' fills the gaps between the semiconductor dies 110' and the lower conductive vias 130, and may be in contact with the dielectric layer 170. The lower encapsulating material 120' may include a molding compound resin such as polyimide, PPS, PEEK, PES, a heat resistant crystal resin, combinations of these, or the like. The encapsulation of the semiconductor dies 110' and the lower conductive vias 130 may be performed in a molding device (not individually illustrated in FIG. 3). The lower encapsulating material 120' may be placed within a molding cavity of the molding device, or else may be injected into the molding cavity through an injection port.

Once the lower encapsulating material 120' has been placed into the molding cavity such that the lower encapsulating material 120' encapsulates the carrier substrate 300, the semiconductor dies 110' and the lower conductive vias 130, the lower encapsulating material 120' may be cured in order to harden the encapsulating material 120' for optimum protection. Additionally, initiators and/or catalysts may be included within the encapsulating material 120' to better control the curing process. In some embodiments, a top surface of the encapsulating material 120' may be higher than the top ends of the lower conductive vias 130 and the top surface of the dielectric layer 116'. Namely, the lower encapsulating material 120' covers the top ends of the lower conductive vias 130 and the top surface of the dielectric layer 116'.

Figure 4:
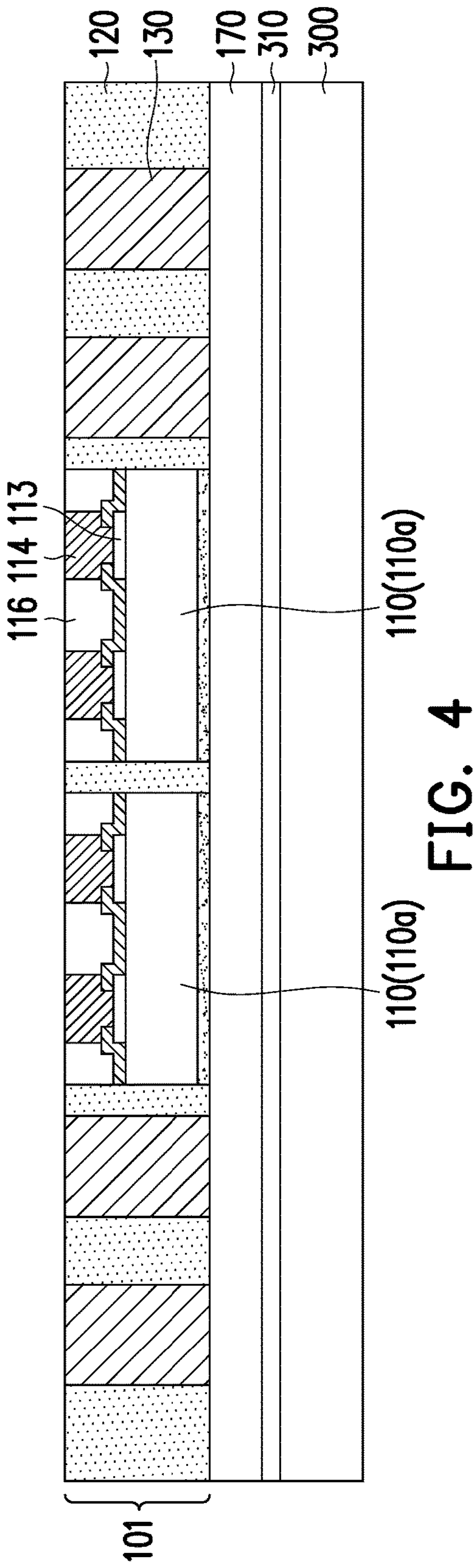

With reference now to FIG. 4, a thinning process may be performed on the lower encapsulating material 120' (and the dielectric layer 116') to reveal the top ends of the lower conductive vias 130 and the top surfaces of the connectors 114 for further processing. The thinning process may be, for example, a mechanical grinding or CMP process whereby chemical etchants and abrasives are utilized to react and grind away the lower encapsulating material 120', the semiconductor dies 110' until the lower conductive vias 130, the connectors 114 have been revealed. The resulting structure is shown in FIG. 4. After the thinning process is performed, the top ends of the lower conductive vias 130 are substantially level with the top surfaces of the connectors 114, and are substantially level with the top surface of the lower encapsulating material 120 and the top surface of the dielectric layer 116 as shown in FIG. 4. However, while the CMP process described above is presented as one illustrative embodiment, it is not intended to be limiting to the embodiments. Any other suitable removal process may alternatively be used to thin the lower encapsulating material 120, the semiconductor dies 110 and expose the lower conductive vias 130. For example, a series of chemical etches may alternatively be utilized. This process and any other suitable process may alternatively be utilized to thin the lower encapsulating material 120, the semiconductor dies 110 and the lower conductive vias 130, and all such processes are fully intended to be included within the scope of the embodiments.

Throughout the description, the resultant structure including the semiconductor die set 110 (including a plurality of semiconductor dies 110*a* and 110*b*), the lower conductive vias 130 and the lower encapsulating material 120 is referred to as lower encapsulated semiconductor device 101, which may have a wafer form in the process. Accordingly, in the lower encapsulated semiconductor device 101, the lower conductive vias 130 extend through the lower encapsulating material 120, and the lower encapsulating material 120 at least laterally encapsulates the lower conductive vias 130 and the semiconductor dies 110*a* and 110*b*.

With reference now to FIG. 5, a lower redistribution structure 140 is formed over a first side of the lower encapsulated semiconductor device 101. The lower redistribution structure 140 is electrically connected to the semiconductor dies 110 and the lower conductive vias 130. In some embodiments, the lower redistribution structure 140 are formed over the lower encapsulated semiconductor device 101 to connect to the connectors 114 of the semiconductor dies 110 and the lower conductive vias 130. In some embodiments, the lower redistribution structure 140 may also interconnect the connectors 114 and the lower conductive vias 130. The lower redistribution structure 140 may be formed by, for example, depositing conductive layers, patterning the conductive layers to form metallization pattern (redistribution circuits) 142, partially covering the metallization pattern 142 and filling the gaps between the metallization pattern 142 with dielectric layers 143, etc. The material of the metallization pattern 142 may include a metal or a metal alloy including aluminum, copper, tungsten, and/or alloys thereof. The dielectric layers 143 may be formed of dielectric materials such as oxides, nitrides, carbides, carbon nitrides, combinations thereof, and/or multi-layers thereof. The redistribution circuits 142 are formed in the dielectric layers 143 and electrically connected to the semiconductor dies 110 and the lower conductive vias 130.

Throughout the description, the resultant structure including the lower redistribution structure 140, and the lower encapsulated semiconductor device 101 as shown in FIG. 5 is referred to as a lower fan-out tier 100, which may have a wafer form in the process.

Then, an upper package (e.g. the upper fan-out tier 200 shown in FIG. 11) may be formed on the lower fan-out tier 100 to form a package on package structure (e.g. the semiconductor package 10 shown in FIG. 14). In accordance with some embodiments, the upper fan-out tier 200 is a sensor package, wherein a sensor die is packaged in an integrated fan-out (InFO) package. The sensor die may include sensing regions at the active and/or back surfaces of the sensor die. The sensor package may include openings that expose the sensing regions of the sensor die, while other regions (e.g., input/output (I/O) regions) of the sensor die may remain protected. Packaging a sensor die in an InFO package may allow the form factor of the final sensor package to be smaller, may increase the mechanical reliability of the packaged sensor, and may increase the manufacturing yield as compared to other (e.g., wire bond) packaging schemes.

Figure 6:
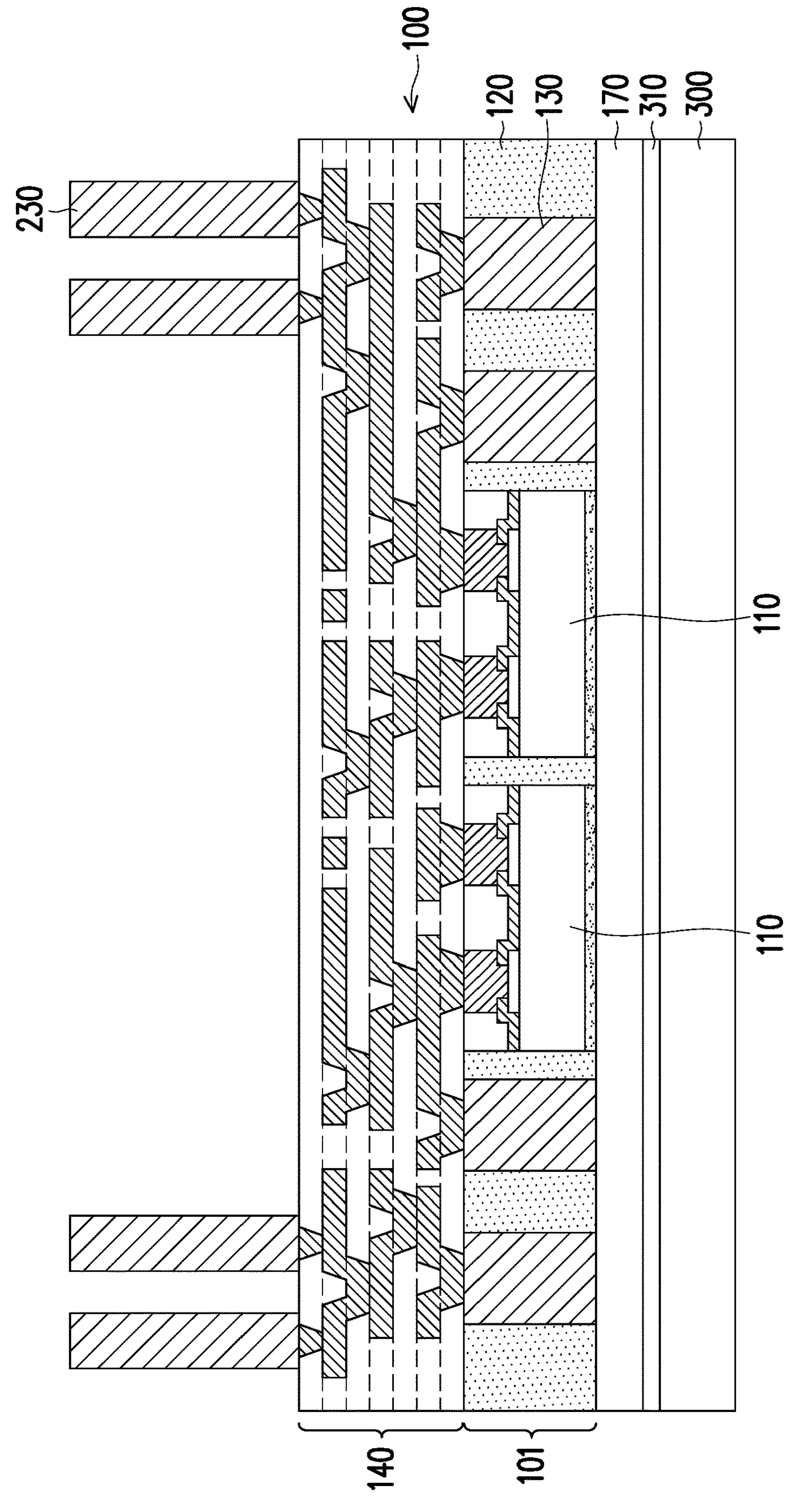

With now reference to FIG. 6, in accordance with some embodiments, at least one (upper) conductive via 230 (multiple upper conductive vias 230 are illustrated, but not limited thereto) is formed on and extending away from the lower redistribution structure 140. The formation of the upper conductive vias 230 may be the same or at least similar to the formation of the lower conductive vias 130. In the present embodiment, the upper conductive vias 230 are formed (e.g., plated) on the lower redistribution structure 140, but the disclosure is not limited thereto. In other embodiments, the upper conductive vias 230 may be preformed, and are then placed (e.g., soldered) on the lower redistribution structure 140.

Figure 7:
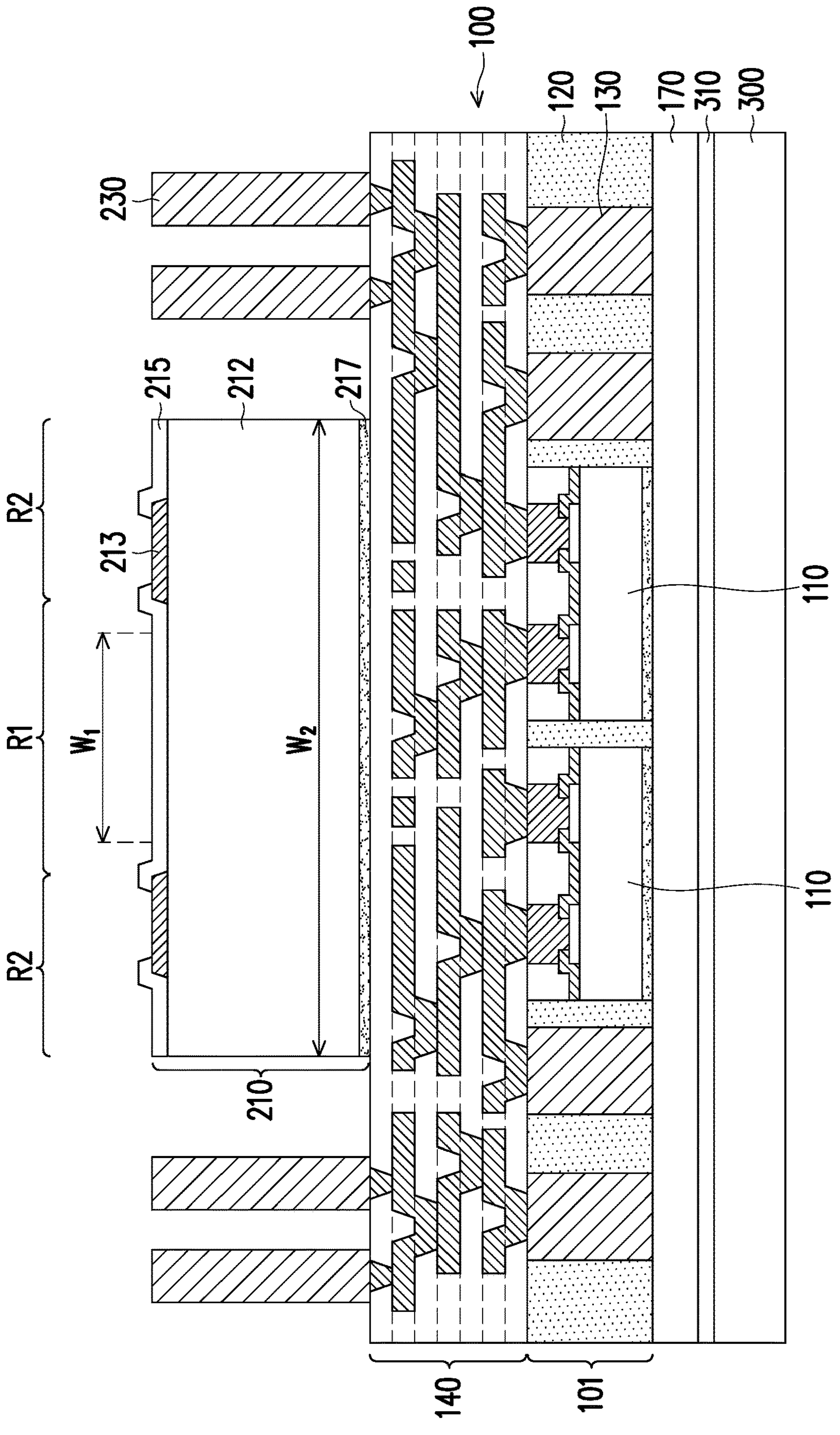

Referring to FIG. 7, a sensor die 210 is placed on the lower redistribution structure 140 adjacent to the upper conductive vias 230. In some embodiments, the sensor die 210 is adhered to the lower redistribution structure 140 by an adhesive 217. Before being placed on the lower redistribution structure 140, the sensor die 210 may be processed according to applicable manufacturing processes to form integrated circuits in the sensor die 210. For example, the sensor die 210 includes a semiconductor substrate 212, such as silicon, doped or undoped, or an active layer of a semiconductor-on-insulator (SOI) substrate. The semiconductor substrate may include other semiconductor materials, such as germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. Other substrates, such as multi-layered or gradient substrates, may also be used. Devices, such as transistors, diodes, capacitors, resistors, etc., may be formed in and/or on the active surface of the semiconductor substrate 212 and may be interconnected by interconnect structures formed by, for example, metallization patterns in one or more dielectric layers on the semiconductor substrate 212 to form an integrated circuit.

In some embodiments, the sensor die 210 further includes at least one pad 213 (multiple pads are illustrated, but not limited thereto), such as aluminum pads, copper pads, or the like, to which external connections are made. The pads 213 are on the active surface of the sensor die 210. One or more passivation layer 215 are on the sensor die 210 and on portions of the pads 213. Openings extend through the passivation layers 215 to expose the pads 213.

In some embodiments, the sensor die 210 may be an image sensor, an acoustic sensor, or the like. The sensor die 210 may include one or more transducers and may also include one or more features that emit signals for measurement during operation. For example, the sensor die 210 may be a fingerprint sensor that operates by emitting ultrasonic acoustic waves and measuring reflected waves. The sensor die 210 has a sensing region R1 and an I/O region R2 at the active surface. The I/O region R2 may (or may not) surround the sensing region R1, and the pads 213 are disposed within the I/O region. The sensing region R1 has a width W1, which is substantially less than the overall width W2 of the sensor die 210. In some embodiments, the sensor die 210 is packaged in an InFO package, and is packaged in a manner that allows the sensing region R1 to be exposed.

In some embodiments, the adhesive 217 is on the back surface of the sensor die 210 and adheres the sensor die 210 to the lower redistribution structure 140. The adhesive 217 may be any suitable adhesive, epoxy, die attach film (DAF), or the like. The adhesive 217 may be applied to a back-side of the sensor die 210 or may be applied over the surface of the lower redistribution structure 140. For example, the adhesive 217 may be applied to the back-side of the sensor die 210 before singulating to separate the sensor die 217. Likewise, the adhesive 217 may be applied to the lower redistribution structure 140 before attaching the sensor die 210.

Although one sensor die 210 is illustrated as being adhered in the illustrated package region, it should be appreciated that more sensor dies 210 may be adhered in each package region on the lower redistribution structure 140. For example, multiple sensor dies 210 may be adhered in each package region. In such embodiments, the sensor dies 210 may vary in size and type. In some embodiments, the sensor die 210 may be dies with a large footprint, such as system-on-chip (SoC) devices.

Figure 8:
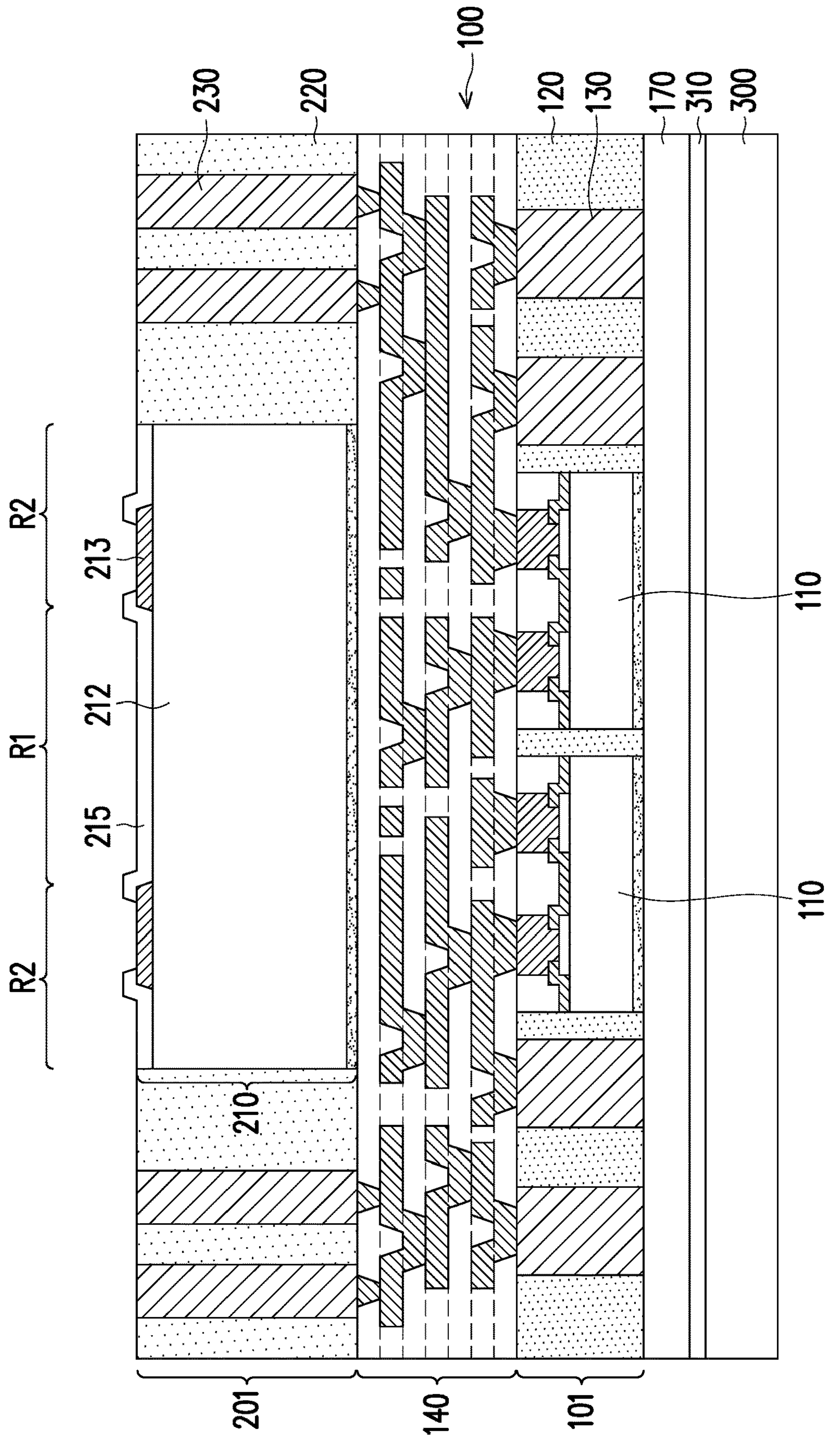

With now reference to FIG. 8, an upper encapsulating material 220 is formed on the various components. After formation, the upper encapsulating material 220 at least laterally encapsulates the upper conductive vias 230 and the sensor die 210. The upper encapsulating material 220 may be a molding compound, epoxy, or the like. The upper encapsulating material 220 may be applied by compression molding, transfer molding, or the like. The upper encapsulating material 220 is then cured. In the embodiment shown, the upper encapsulating material 220 is formed by transfer molding, such that the upper conductive vias 230 and the sensor die 210 are exposed after molding, and planarization step(s) (e.g., a CMP) may be omitted. Because transfer molding is used to form the upper encapsulating material 220, recesses (not shown) may be formed in the upper encapsulating material 220, between respective ones of the upper conductive vias 230 and the sensor die 210. Namely, the upper surface of the upper encapsulating material 220 may be a rather rough surface. For simplicity of the drawings, the upper surface of the upper encapsulating material 220 is illustrated as a planar surface. Further, in the embodiment shown, a topmost surface of the passivation layer 215 may be above a topmost surface of the upper encapsulating material 220.

Throughout the description, the resultant structure including the sensor die 210, the upper conductive vias 230 and the upper encapsulating material 220 is referred to as upper encapsulated semiconductor device 201, which may have a wafer form in the process. Accordingly, in the upper encapsulated semiconductor device 201, the upper conductive vias 230 extend through the upper encapsulating material 220 and connected to the lower redistribution structure 140, and the upper encapsulating material 220 at least laterally encapsulates the upper conductive vias 230 and the sensor die 210.

Figure 9:
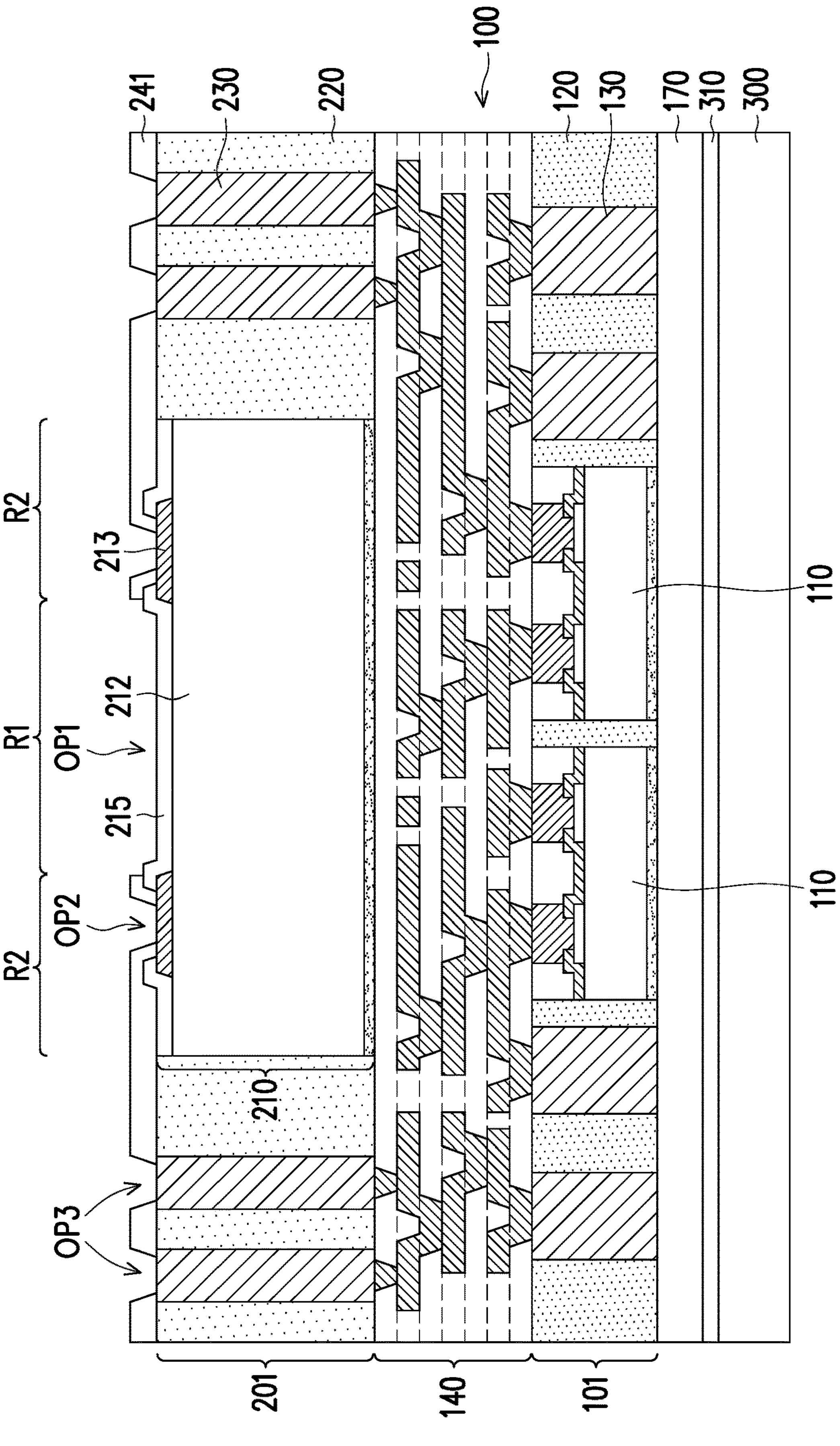
Figure 10:
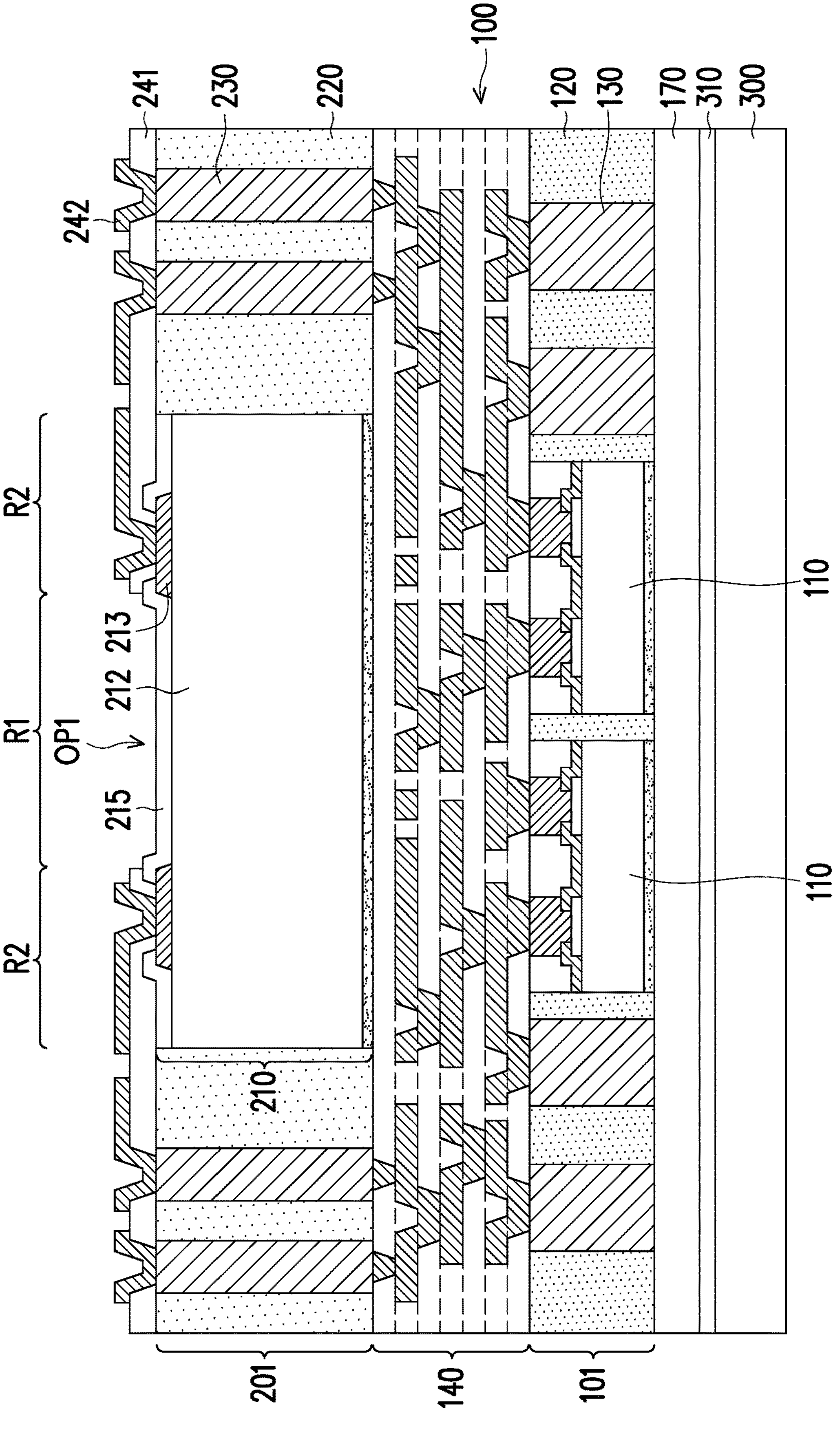
Figure 11:
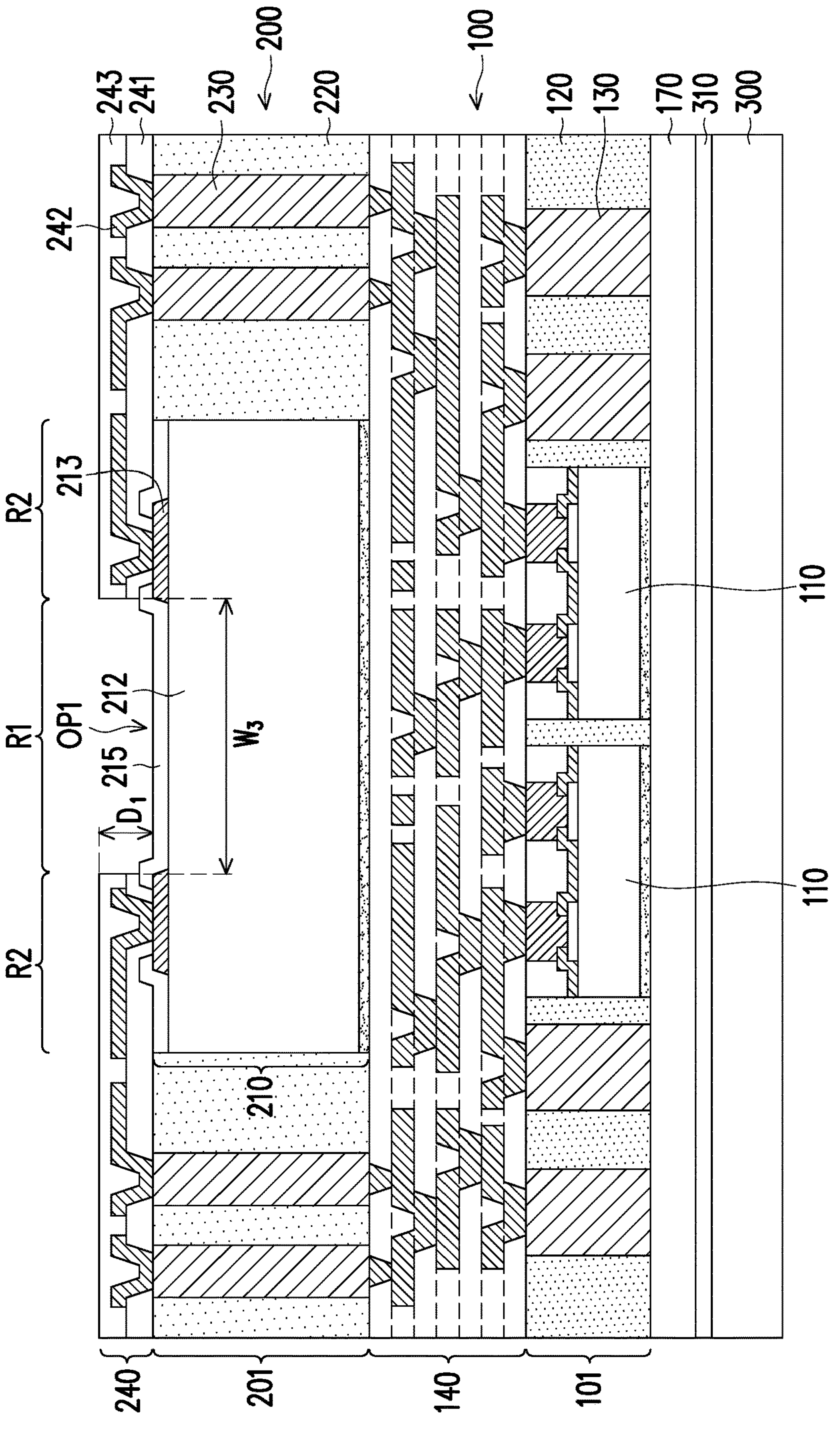

FIG. 9 through FIG. 11 illustrate formation of an upper redistribution structure 240 (see FIG. 11) over the upper encapsulated semiconductor device 210. The upper redistribution structure 240 includes a first dielectric layer 241, a metallization pattern 242, and a second dielectric layer 243. The metallization patterns may also be referred to as redistribution lines or redistribution circuits. The upper redistribution structure 240 is shown as an example, and one example process to form the upper redistribution structure 240 is discussed herein. More or fewer dielectric layers and metallization patterns may be formed in the upper redistribution structure 240. If more dielectric layers and metallization patterns are to be formed, steps and processes discussed below may be repeated.

In accordance with some embodiments of the disclosure, the upper redistribution structure 240 (see FIG. 8) includes an opening OP1 exposing the sensing region R1 of the sensor die 210. The opening OP1 extends through the dielectric layers 241 and 243 of the upper redistribution structure 240. The metallization pattern 242 is not formed in the opening OP1, such that the opening OP1 is free from the materials of the upper redistribution structure 240 (e.g., materials of the metallization pattern 242 and the dielectric layers 241 and 243). In other words, an air gap (the opening OP1) is formed over the sensing region R1, wherein the air gap is laterally disposed between portions of the upper redistribution structure 240 and is free from liquid and solid materials. The opening OP1 exposes the sensing region R1 of the sensor die 210, allowing it to be used even when the sensor die 210 is packaged and encapsulated. After forming the opening OP1, the I/O region R2 (the pads 213) of the sensor die 210 remains covered by the upper redistribution structure 240. That is, the upper redistribution structure 240 is connected to the pads 213 and revealing the sensing region R1 of the sensor die 210. In some embodiments, the opening OP1 has a width W3, which may be greater than or equal to the width W1 of the sensor region R1. In some embodiments, the sensing region R1 of the sensor die 210 and the opening OP1 of the upper redistribution structure 240 have the same width (W1 substantially equals to W3).

With now reference to FIG. 9, the first dielectric layer 241 is formed on the upper encapsulated semiconductor device 201. In detail, the first dielectric layer 214 is deposited on the upper encapsulating material 220, the upper conductive vias 230, and the sensor die 210 (e.g., on the passivation layer 215 and the pads 213). In some embodiments, the first dielectric layer 241 is formed of a photo-sensitive material such as PBO, polyimide, BCB, or the like, which may be patterned using a lithography mask. The first dielectric layer 241 may be formed by spin coating, lamination, CVD, the like, or a combination thereof.

Then, the dielectric layer 241 is patterned. The patterning process forms openings OP1, OP2, and OP3 which, respectively, reveal the sensing region R1, the pads 213, and the upper conductive vias 230. The width of the opening OP1 is greater than the widths of the openings OP2 and OP3. The patterning may be by an acceptable process, such as by exposing the first dielectric layer 241 to light when the dielectric layer 241 is a photo-sensitive material or by etching using, for example, an anisotropic etch. If the dielectric layer 241 is a photo-sensitive material, the dielectric layer 241 can be developed after the exposure.

Referring to FIG. 10, the metallization pattern 242 is formed. The metallization pattern 242 includes conductive lines on and extending along the major surface of the dielectric layer 241. The metallization pattern 242 further includes conductive vias extending through the dielectric layer 241 to be physically and electrically connected to the upper conductive vias 230 and the sensor die 210 (e.g., by the pads 213). The opening OP1 of the first dielectric layer 241 is free of the metallization pattern 242.

When the upper encapsulating material 220 has recesses (rougher top surface), top surfaces of the upper encapsulating material 220, the upper conductive vias 230, and the sensor die 210 may not be level (e.g., in embodiments where a planarization step is omitted). In such embodiments, the vias of the metallization pattern 242 that are connected to the sensor die 210 may have different lengths than the vias of the metallization pattern 242 that are connected to the conductive vias 230.

To form the metallization pattern 242, a seed layer is formed over the dielectric layer 241 and in the openings OP1, OP2, and OP3 extending through the dielectric layer 241. In some embodiments, the seed layer is a metal layer, which may be a single layer or a composite layer including a plurality of sub-layers formed of different materials. In some embodiments, the seed layer is a titanium layer and a copper layer over the titanium layer. The seed layer may be formed using, for example, PVD or the like. A photo resist is then formed and patterned on the seed layer. The photo resist may be formed by spin coating or the like and may be exposed to light for patterning. The pattern of the photo resist corresponds to the metallization pattern 242. The patterning forms openings through the photo resist to expose the seed layer. A conductive material is then formed in the openings of the photo resist and on the exposed portions of the seed layer. The conductive material may be formed by plating, such as electroplating or electroless plating, or the like. The conductive material may be a metal, like copper, titanium, tungsten, aluminum, the like, or combinations thereof. The combination of the conductive material and underlying portions of the seed layer form the metallization pattern 148. The photo resist and portions of the seed layer on which the conductive material is not formed are removed. The photo resist may be removed by an acceptable ashing or stripping process, such as using an oxygen plasma or the like. Once the photo resist is removed, exposed portions of the seed layer are removed, such as by using an acceptable etching process, such as by wet or dry etching.

Referring to FIG. 11, the second dielectric layer 243 is formed (e.g., deposited) on the metallization pattern 242 and the first dielectric layer 241. The second dielectric layer 243 may be formed in a manner similar to the first dielectric layer 241, and may be formed of the same material as the first dielectric layer 241. The opening OP1 is then extended through the second dielectric layer 243 by patterning the second dielectric layer 243 in a similar manner as the patterning of the first dielectric layer 241. After the opening OP1 is extended, it has a first depth D1 extending from a major surface of the passivation films 215 to a topmost surface of the second dielectric layer 243. In some embodiments, the first depth D1 is in the range of from about 17 μm to about 25 μm (such as less than about 25 μm). The sensing region R1 of the sensor die 210 is then revealed by the opening OP1.

In the embodiment shown, the opening OP1 is formed during formation of the upper redistribution structure 240. The opening OP1 may also be formed after formation of the upper redistribution structure 240. For example, the opening OP1 may be formed through the dielectric layers 214 and 243 by an anisotropic etch after the dielectric layers 241 and 243 are both formed.

Throughout the description, the resultant structure including the upper redistribution structure 240, and the upper encapsulated semiconductor device 201 as shown in FIG. 11 is referred to as an upper fan-out tier 200, which may have a wafer form in the process.

Figure 12:
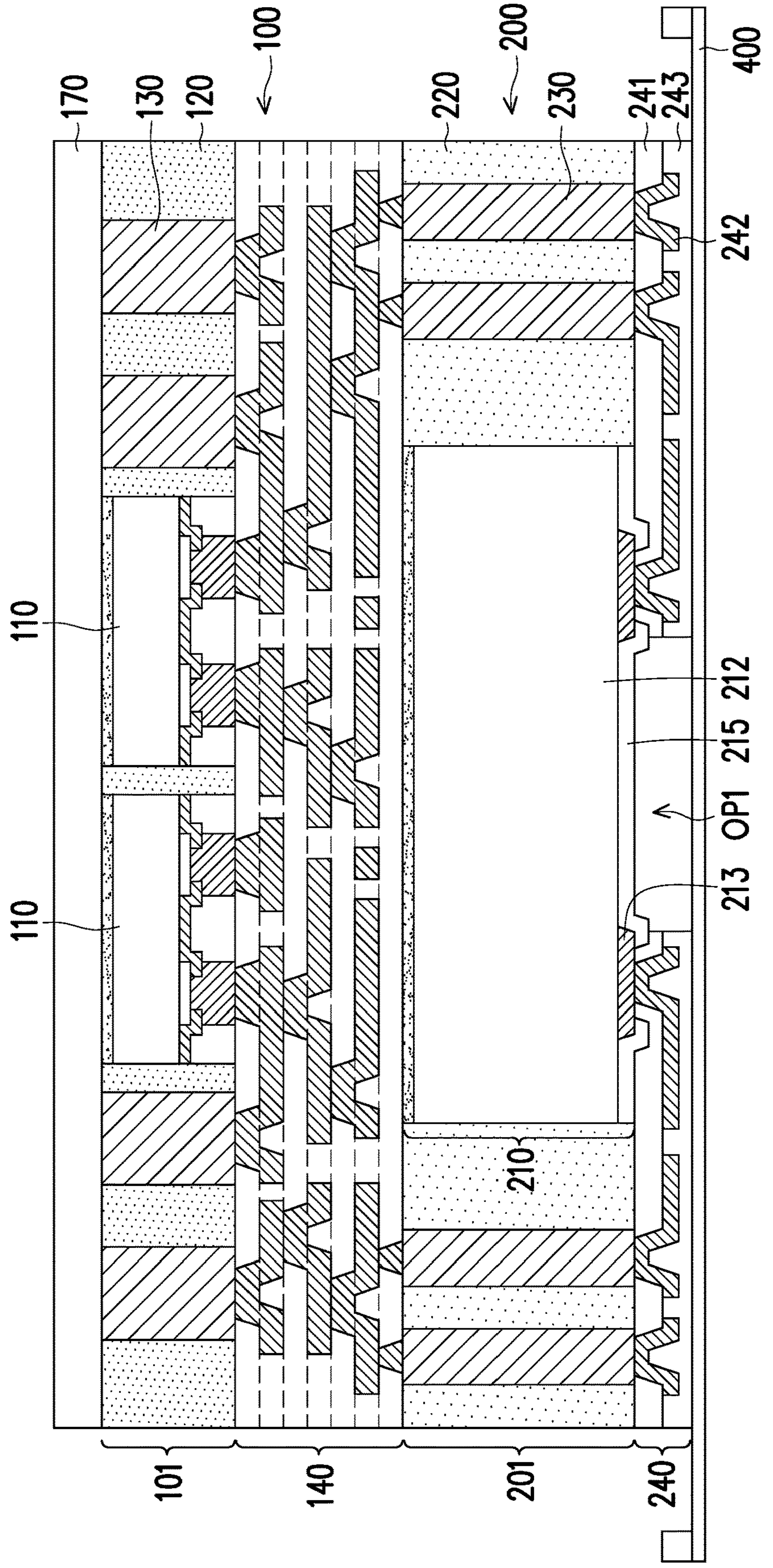

Referring to FIG. 11 and FIG. 12, the resultant structure may then be flipped over and placed on a tape 400, and a de-bonding process may be performed on the carrier substrate 300 to detach (or "de-bond") the carrier substrate 300 from the adhesive layer 310 and the dielectric layer 170. In some embodiments, the de-bonding may include projecting a light such as a laser light or an UV light on the adhesive layer 310 so that the adhesive layer 310 decomposes under the heat of the light and the carrier substrate 300 can be removed.

Figure 13:
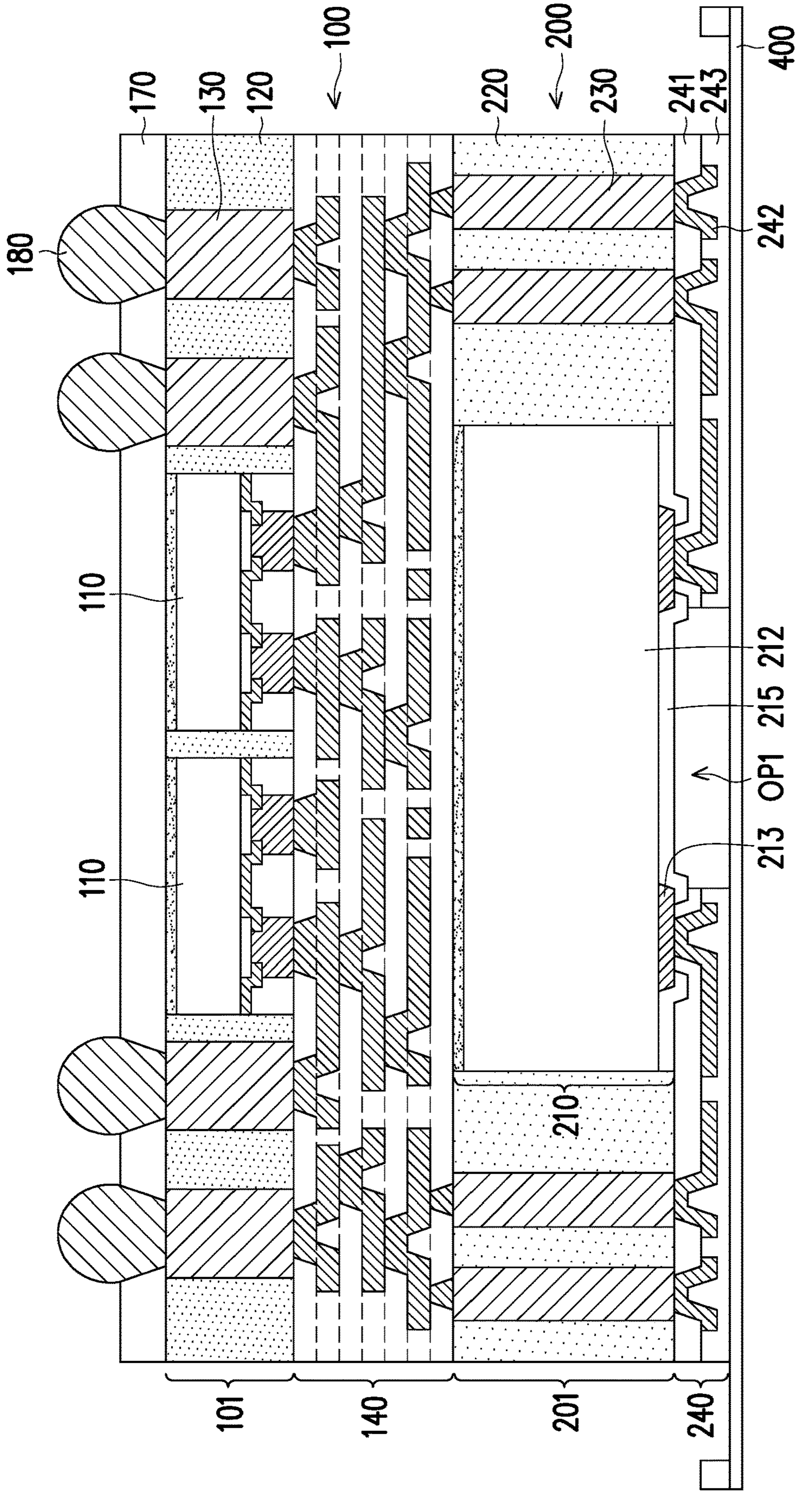

Referring to FIG. 13, a plurality of openings 172 may be formed through the dielectric layer 170 to reveal portions of the lower conductive vias 130. The openings 172 may be formed, for example, using laser drilling, etching, or the like. A cleaning process may be performed after the laser drilling process, to remove remaining residue of the dielectric layer 170.

Then, a plurality of conductive connectors 180 are formed in the openings 172, physically and electrically connected the lower conductive vias 130. The conductive connectors 180 may include a conductive material such as solder, copper, aluminum, gold, nickel, silver, palladium, tin, the like, or a combination thereof. In some embodiments, the conductive connectors 180 are formed by initially forming a layer of solder through such commonly used methods such as evaporation, electroplating, printing, solder transfer, ball placement, or the like. Once a layer of solder has been formed on the structure, a reflow may be performed in order to shape the material into the desired bump shapes. In some embodiments, the conductive connectors 180 include flux and are formed in a flux dipping process. In some embodiments, the conductive connectors 180 include a conductive paste such as solder paste, silver paste, or the like, and are dispensed in a printing process.

Referring to FIG. 13 and FIG. 14, then, a plurality of semiconductor packages 10 (one semiconductor package 10 is illustrated herein for simplicity purpose) is formed by performing a singulation process along scribe lines. The singulation may be by sawing, laser drilling, or the like along the scribe lines between adjacent package regions. The singulation process separates the adjacent the semiconductor packages 10. The resulting singulated semiconductor package 10 is shown in FIG. 14.

In accordance with some embodiments, the semiconductor package 10 may be mounted to a package substrate using the conductive connectors 180 to form a sensing device, for example. The sensing device may be any suitable device that implements the semiconductor package 10, such as a smartphone, a tablet, or the like. In some embodiments, the package substrate may include active and passive devices (not shown). As one of ordinary skill in the art will recognize, a wide variety of devices such as transistors, capacitors, resistors, combinations of these, and the like may be used to generate the structural and functional requirements of the design for the sensing device. The devices may be formed using any suitable methods.

In accordance with some embodiments, the package substrate may be made of a semiconductor material such as silicon, germanium, diamond, or the like. Alternatively, compound materials such as silicon germanium, silicon carbide, gallium arsenic, indium arsenide, indium phosphide, silicon germanium carbide, gallium arsenic phosphide, gallium indium phosphide, combinations of these, and the like, may also be used. Additionally, the package substrate may be a SOI substrate. Generally, a SOI substrate includes a layer of a semiconductor material such as epitaxial silicon, germanium, silicon germanium, SOI, SGOI, or combinations thereof. The package substrate is, in one alternative embodiment, based on an insulating core such as a fiberglass reinforced resin core. One example core material is fiberglass resin such as FR4. Alternatives for the core material include bismaleimide-triazine BT resin, or alternatively, other PCB materials or films. Build up films such as ABF or other laminates may be used for package substrate.

With such configuration, the sensor die 210 is packaged in an integrated fan-out (InFO) package. Namely, the upper fan-out tier 200 of the semiconductor package 10 is a sensor package. The sensor package includes an opening that reveals the sensing region R1 of the sensor die 210, while other regions (e.g., input/output (I/O) regions) of the sensor die 210 may remain protected. Accordingly, packaging the sensor die 210 in an InFO package allows the form factor of the final package to be smaller, increases the mechanical reliability of the packaged sensor die, and may increase the manufacturing yield as compared to other (e.g., wire bond) packaging schemes.

In addition, the semiconductor package 10 adopts heterogeneous integration so that the sensor package (upper package 100) with exposed sensing region R1 can be integrated with other InFO package (lower fan-out tier 100). Accordingly, the sensor die 210 can be boned with other semiconductor dies 110 such as computing and/or memory die in a package on package structure. In some embodiments, the sensor die 210 may be a die with a large footprint. The computing and/or memory die may be a die with smaller footprint such as an ASIC, a DSP, a DRAM, etc. Therefore, to balance the size of the upper fan-out tier 200 and the lower fan-out tier 100, a set of semiconductor dies 110*a*, 110*b* may be arranged in a side by side manner in the lower fan-out tier 100. In some embodiments, the first semiconductor die 110*a* may include an ASID, a DSP, a DRAM, etc., and the second semiconductor die 110*b* may include a PMIC, a logic die, a dummy die, etc. However, the disclosure does not limit the types of the semiconductor dies 110*a*, 110*b*. Such package and method allow the form factor of the semiconductor package 10 to be smaller, shorten electrical interconnect distance, and facilitates data computing efficiency as compared to other packaging schemes (e.g., sensor die wire bonded to a board where computing and/or memory dies mounted).

Figure 15:
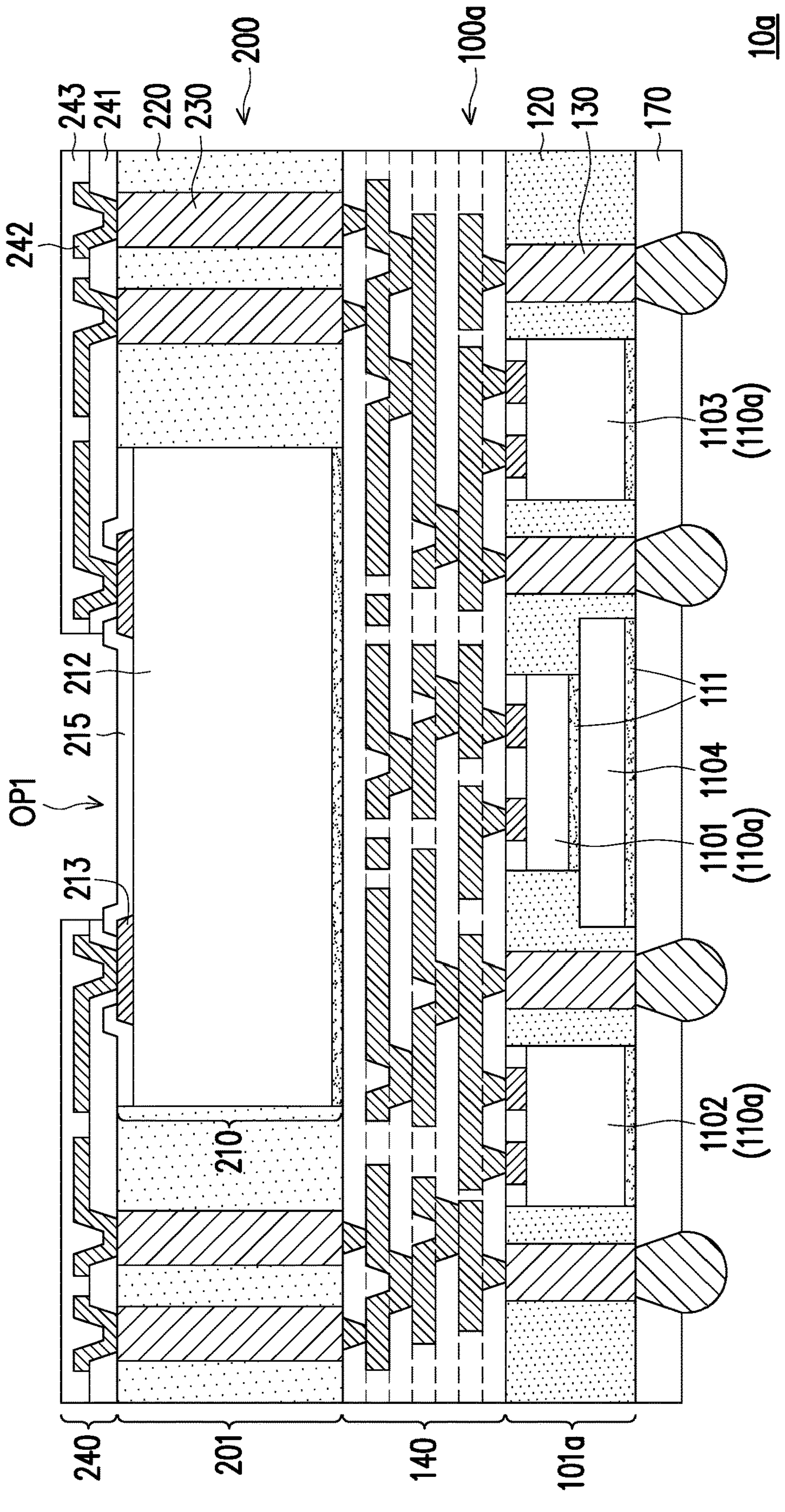
FIG. 15 illustrates a cross sectional view of a semiconductor package according to some exemplary embodiments of the present disclosure.

FIG. 15 illustrates a cross sectional view of a semiconductor package according to some exemplary embodiments of the present disclosure. It is noted that the semiconductor package 10*a* shown in FIG. 15 contains many features same as or similar to the semiconductor package 10 disclosed earlier with FIG. 1 to FIG. 14. For purpose of clarity and simplicity, detail description of same or similar features may be omitted, and the same or similar reference numbers denote the same or like components. The main differences between the semiconductor package 10*a* shown in FIG. 15 and the semiconductor package 10 disclosed earlier with FIG. 1 to FIG. 14 are described as follows.

In some embodiments, the semiconductor die set 110*a* may include a plurality of semiconductor dies 1101, 1102, 1103. For example, the semiconductor die set 110*a* includes at least one first semiconductor die 1101 (one first semiconductor die 1101 is illustrated but not limited thereto) and at least one second semiconductor die 1102, 1103 (two second semiconductor dies 1102, 1103 are illustrated but not limited thereto) disposed at a side of the first semiconductor die 1101. In some embodiments, the second semiconductor dies 1102, 1103 are disposed at two opposite sides of the first semiconductor die 1101 respectively.

In accordance with some embodiments of the disclosure, the first semiconductor die 1101 may include computing dies such as an ASIC, and/or a DSP. In some embodiments, the computing dies are generally formed in advanced semiconductor process technology and having smaller footprint compared to the sensor die 210. Therefore, a plurality of second semiconductor dies 1102, 1103 may be arranged around the first semiconductor die 1101 for high-density integration and to even the sizes of the upper fan-out tier 200 with sensor die 210 and the lower package 200*a* with computing/memory dies. In some embodiments, the second semiconductor dies 1102, 1103 may include a dynamic random access memory (DRAM), a power management integrated circuit (PMIC), a logic die, a dummy die, or any combination thereof. The lower conductive vias 130 may be disposed between the first semiconductor die 1101 and the second semiconductor dies 1102, 1103 as it is shown in FIG. 15. That is, at least one of the lower conductive vias 130 is disposed between the first semiconductor die 1101 and the second semiconductor dies 1102 and 1103. In an alternative embodiment, the lower conductive vias 130 are disposed around the semiconductor set 110. The disclosure does not limit the number and the arrangement of the semiconductor dies 1101, 1102, 1103.

In some embodiments, the lower encapsulated semiconductor device 101*a* may further include a carrier 1104 disposed under the first semiconductor die 1101 (e.g., the computing die). The carrier 1104 is also encapsulated by the lower encapsulating material 120. For example, the carrier 1104 and the second semiconductor die may firstly be placed over the carrier substrate (e.g., the carrier substrate 300 shown in FIG. 2) through adhesive 111. To be specific, in the present embodiment, the carrier 1104 and the second semiconductor die is placed over the dielectric layer 170 on the carrier substrate 300 through the adhesive 111. As such, the second semiconductor die 1102 and 1103, the carrier 1104 and the lower conductive via 130 are placed on the same level. Then, the first semiconductor die 1101 is placed on the carrier 1104 through adhesive 111. That is, the adhesive 111 is disposed between the first semiconductor die 1101 and the carrier 1104. The adhesive 111 may be any suitable adhesive, epoxy, die attach film (DAF), or the like.

In accordance with some embodiments of the disclosure, the carrier 1104 may be disposed under the first semiconductor die 1101 in order to reduce CTE mismatch and improve the warpage profile of the resulting package. The carrier 1104 may include any suitable material for adjusting the effective CTE of the lower fan-out tier 100*a* to a desired level. In some embodiments, the carrier 1104 may be a dummy die, and may include a material for lowering the effective CTE of the lower fan-out tier 100*a*, such as silicon, ceramic, glass, etc. In other embodiments, the carrier 1104 may include a material for raising the effective CTE of the lower fan-out tier 100*a*, such as copper, polymer, etc. By including the carrier 1104, a difference between a highest and lowest point of the package (warpage) may be reduced. In addition, the carrier 1104 may be configured for mechanical support and thermal dissipation of the first semiconductor die 1101. In some embodiments, the size (footprint) of the carrier 1104 is greater than that of the first semiconductor die 1101, so as to increase the heat dissipation area of the first semiconductor die 1101.

Figure 16:
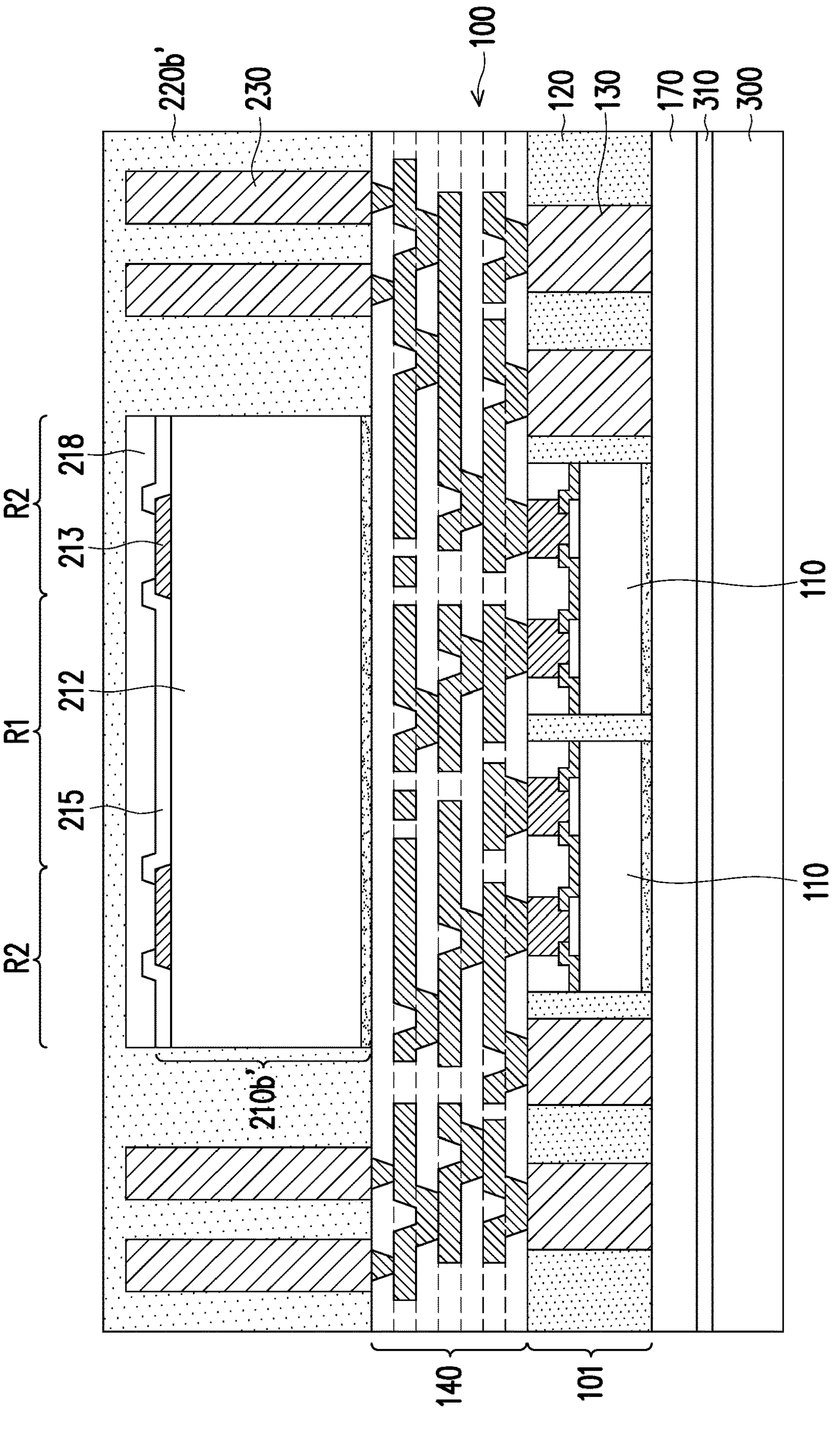
FIG. 16 to FIG. 18 illustrate cross sectional views of an intermediate stage in a manufacturing of a semiconductor package according to some exemplary embodiments of the present disclosure.
Figure 17:
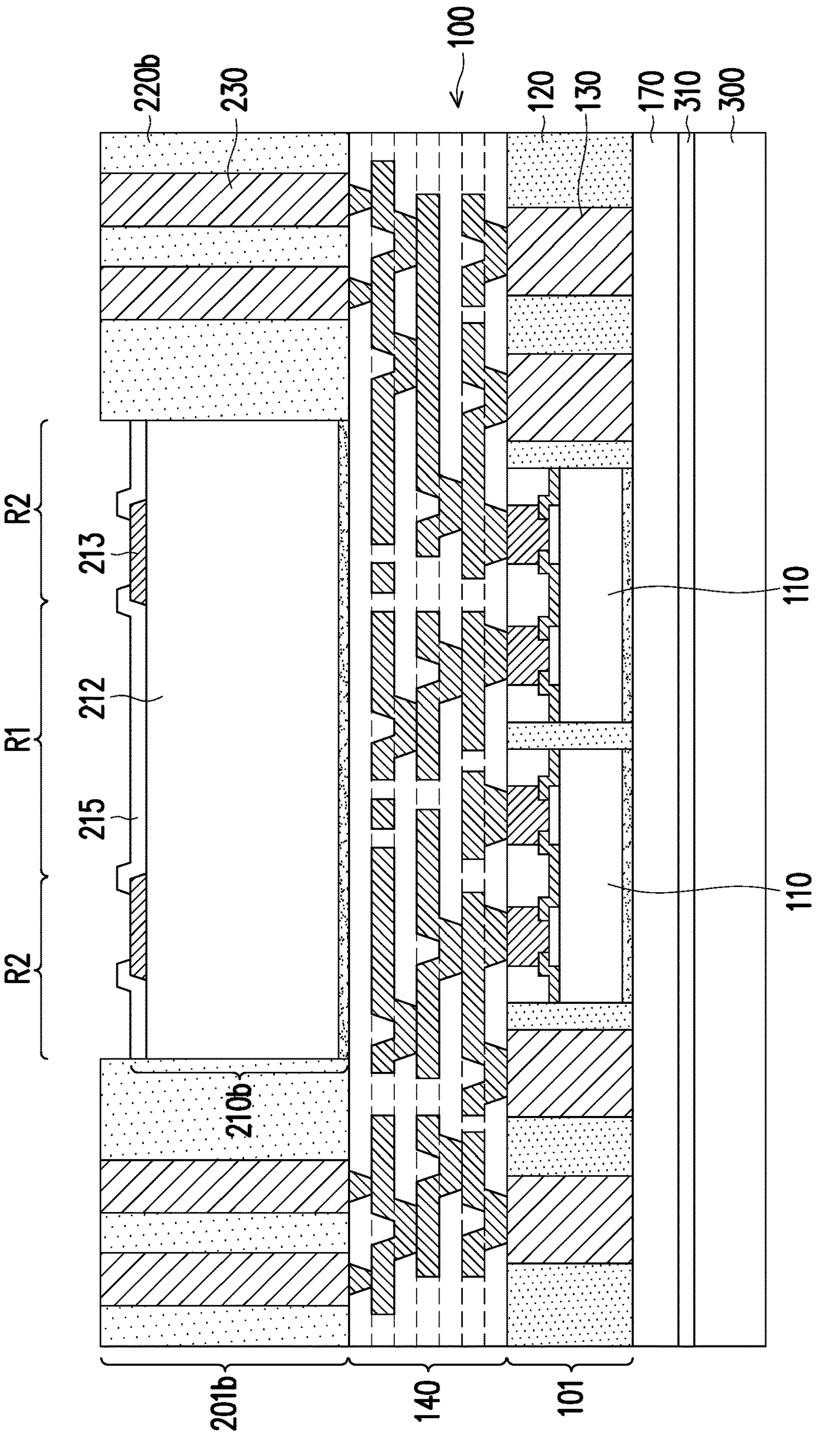
Figure 18:
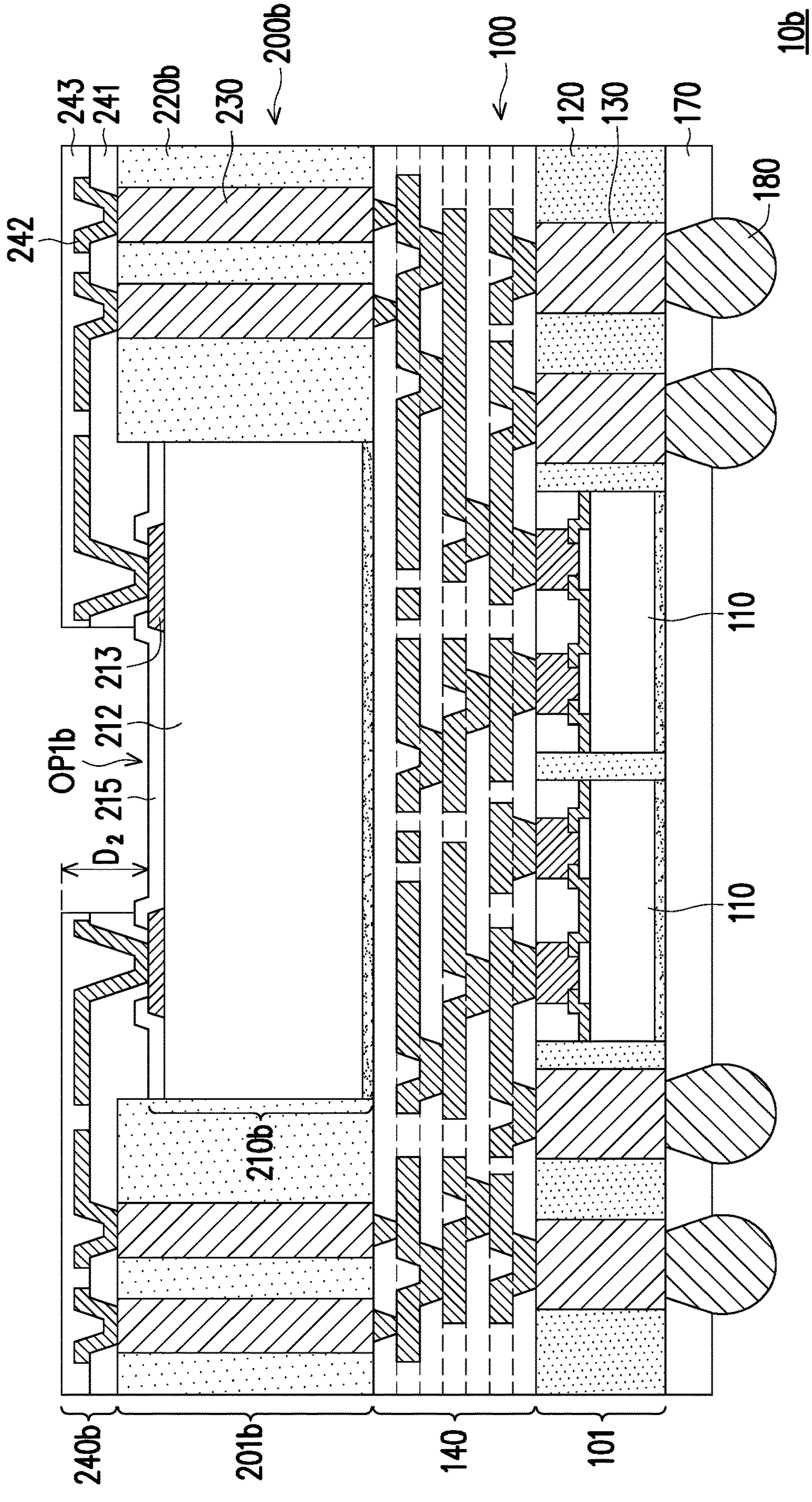

FIG. 16 to FIG. 18 illustrate cross sectional views of an intermediate stage in a manufacturing of a semiconductor package according to some exemplary embodiments of the present disclosure. It is noted that the semiconductor package 10*b* shown in FIG. 16 to FIG. 18 contains many features same as or similar to the semiconductor package 10 disclosed earlier with FIG. 1 to FIG. 14 and the semiconductor package 10*a* illustrated in FIG. 15. For purpose of clarity and simplicity, detail description of same or similar features may be omitted, and the same or similar reference numbers denote the same or like components. The main differences between the semiconductor package 10*b* shown in FIG. 16 to FIG. 18 and the semiconductor packages 10, 10*a* disclosed earlier with FIG. 1 to FIG. 15 are described as follows.

Referring to FIG. 16, in accordance with some embodiments of the disclosure, the sensor die 210*b*' further includes a sacrificial film 126 over the semiconductor substrate 212. In some embodiments, the sacrificial film 126 covers the passivation layer 215 and pads 213. The sacrificial film 166 may be formed of a photo-sensitive polymer, such as polybenzoxazole (PBO), polyimide, benzocyclobutene (BCB), or the like. Then, the encapsulant 142 is formed. The upper encapsulating material 220*b*' is formed by, for example, compression molding, such that the upper conductive vias 230 and sensor die 210*b*' are buried in the upper encapsulating material 220*b*' after the molding.

Then, referring to FIG. 16 and FIG. 17, in some embodiments, a planarization process is performed on the upper encapsulating material 220*b*' to reveal the upper conductive vias 230 and sacrificial film 218. The planarization process may also grind the sacrificial film 218. Top surfaces of the upper conductive vias 230, he upper encapsulating material 220*b*, and sacrificial film 218 are coplanar after the planarization process. The planarization process may be, for example, a chemical-mechanical polish (CMP), a grinding process, or the like. The sacrificial film 218 is then removed for revealing the sensing region R1 of the sensor die 210*b*. In the present embodiment, the sacrificial film 218 is completely removed to reveal the sensing region R1, the passivation layer 215 and the pads 213. In an embodiment of the sacrificial film 218 being a photo-sensitive polymer, the sacrificial film 218 may be removed by exposure and development.

Referring to FIG. 18, in some embodiments, due to removal of the sacrificial film 218, a topmost surface of the passivation layer 215 is below a topmost surface of the upper encapsulating material 220*b*. The opening OP1*b* has a second depth D2 extending from a major surface of the passivation films 215 to a topmost surface of the dielectric layer 243. The second depth D2 is greater than the first depth D1. In some embodiments, the second depth D2 is in the range of from about 22.5 μm to about 32.5 μm. It should be noted that the arrangement of the lower fan-out tier 100*a* shown in FIG. 15 may also be applied to the semiconductor package 10*b* to improve issues of CTE mismatch and warpage and to facilitate heat dissipation.

Figure 19:
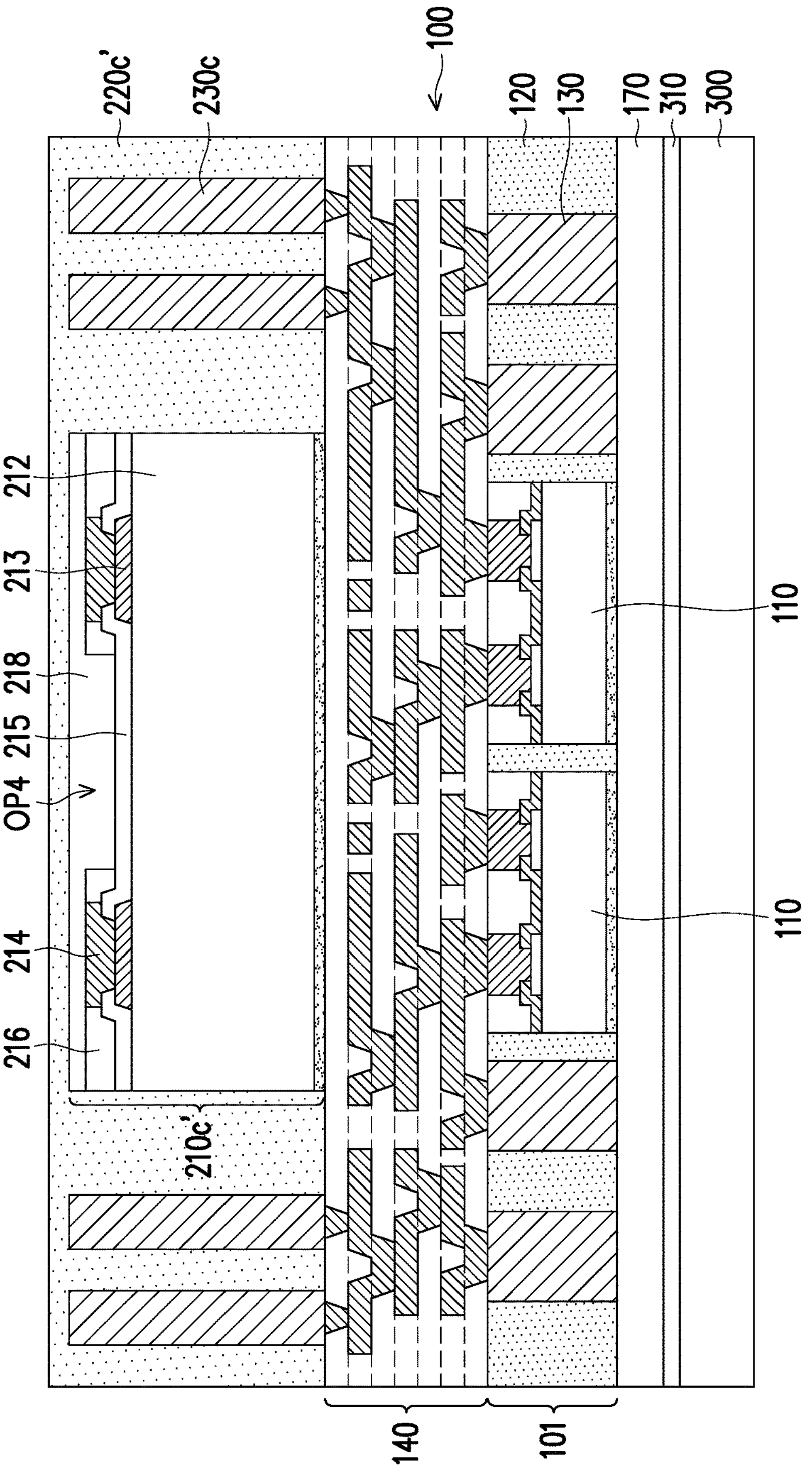
FIG. 19 to FIG. 21 illustrate cross sectional views of an intermediate stage in a manufacturing of a semiconductor package according to some exemplary embodiments of the present disclosure.
Figure 20:
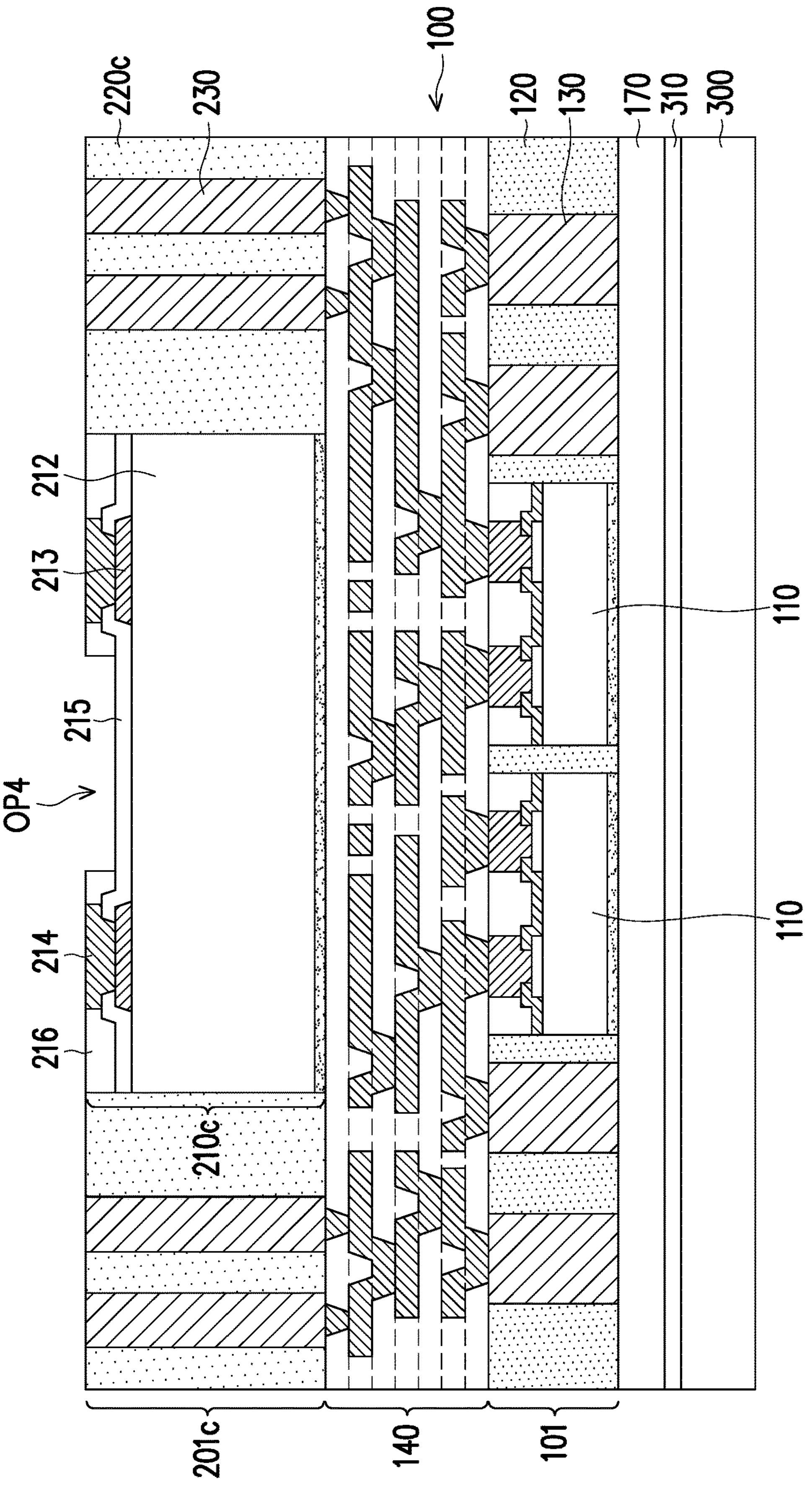
Figure 21:
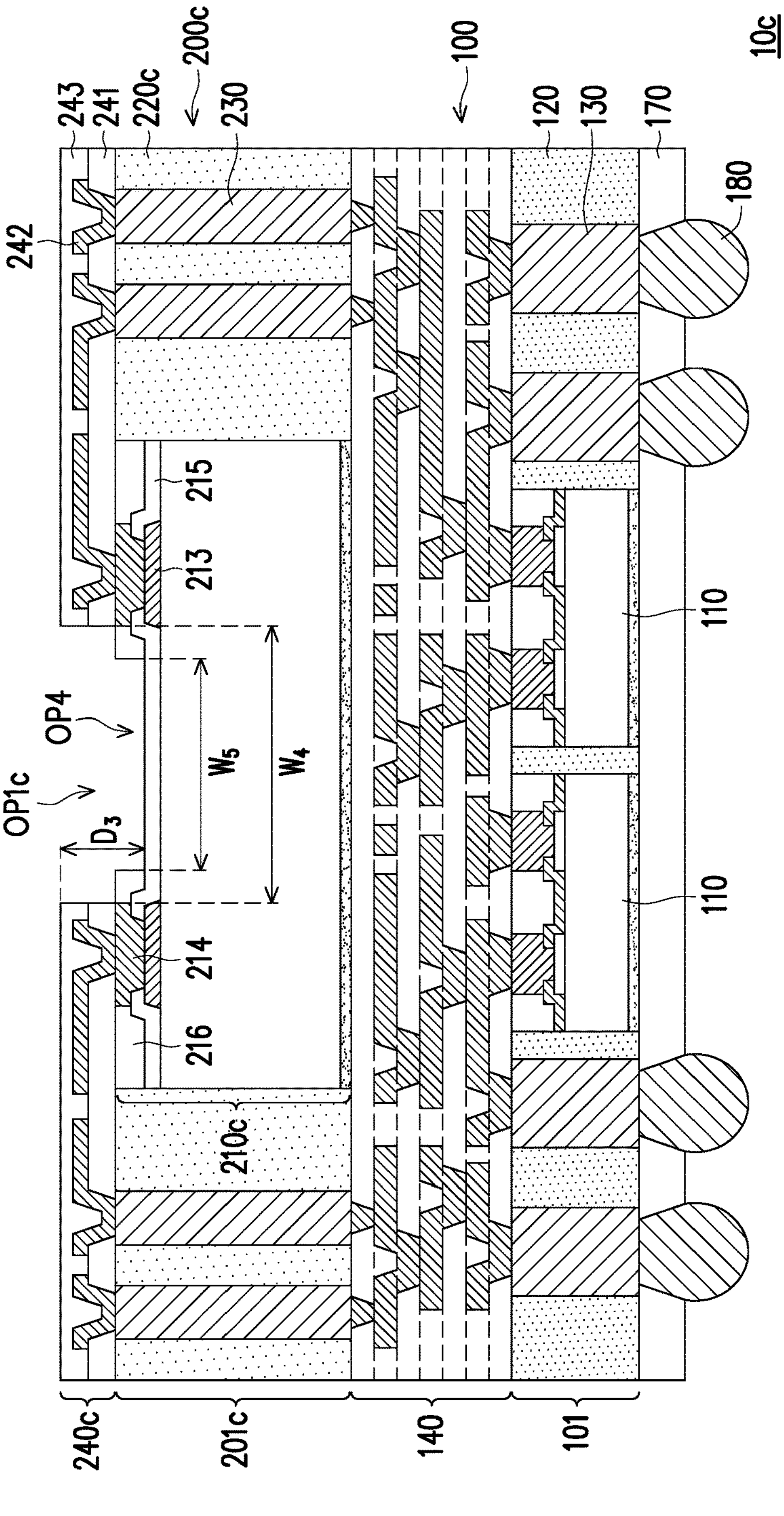

FIG. 19 to FIG. 21 illustrate cross sectional views of an intermediate stage in a manufacturing of a semiconductor package according to some exemplary embodiments of the present disclosure. It is noted that the semiconductor package 10*c* shown in FIG. 19 to FIG. 21 contains many features same as or similar to the semiconductor package 10 disclosed earlier with FIG. 1 to FIG. 14 and the semiconductor package 10*a* illustrated in FIG. 15. For purpose of clarity and simplicity, detail description of same or similar features may be omitted, and the same or similar reference numbers denote the same or like components. The main differences between the semiconductor package 10*c* shown in FIG. 19 to FIG. 21 and the semiconductor packages 10, 10*a* disclosed earlier with FIG. 1 to FIG. 15 are described as follows.

Referring to FIG. 19, in accordance with some embodiments, the sensor die 210*c*' further includes connectors 214, such as conductive pillars (for example, formed of a metal such as copper), which extend through the openings in the passivation layer 215 to be physically and electrically connected to respective one of the pads 213. The connectors 214 may be formed by, for example, plating, or the like. The connectors 214 are thus electrically connected to the integrated circuits of the sensor die 210*c*'. A dielectric material 216 is over the active surface of the sensor die 210*c*', such as on the passivation layer 215 and the connectors 214. The dielectric material 216 laterally encapsulates the connectors 214, and the dielectric material 216 is laterally coterminous with the sensor die 210*c*'. The dielectric material 216 may be a nitride such as silicon nitride or the like, and may be formed, for example, by CVD or the like. The dielectric material 216 includes an opening OP4 revealing the sensing region R1 of the sensor die 210*c*', which may be formed by acceptable photoliWith suchthography and etching techniques. The sacrificial film 218 is initially formed over the dielectric material 216 and in the opening OP4 for covering the sensing region R1.

Then, the upper encapsulating material 220*c*' is formed. The upper encapsulating material 220*c*' is formed by, for example, compression molding, such that the upper conductive vias 230*c* and sensor die 210*c*' are buried in the upper encapsulating material 220*c*' after the molding.

Referring to FIG. 19 and FIG. 20, a planarization process is performed on the upper encapsulating material 220*c*' to reveal the upper conductive vias 230 and the connectors 214. The planarization process may also grind the sacrificial film 218. Topmost surfaces of the upper conductive vias 230, the connectors 214, the upper encapsulating material 220*c*, and the dielectric material 216 are coplanar after the planarization process. The planarization process may be, for example, a CMP, a grinding process, or the like. The sacrificial film 218 is then removed for revealing the sensing region R1 of the sensor die 210*c*. When the sacrificial film 218 is a photo-sensitive polymer, it may be removed by exposure and development.

Referring to FIG. 21, due to removal of the sacrificial film 218, a topmost surface of the passivation layer 215 is below a topmost surface of the upper encapsulating material 220*c*. The opening OP4 of the dielectric layer 216 has a fifth width W5, which may be substantially less than the fourth width W4 of the opening OP1*c* of the upper redistribution structure 240*c*. The openings OP4 and OP1*c* have a combined third depth D3 extending from a major surface of the passivation films 215 to a topmost surface of the dielectric layer 243 (upper redistribution structure 240*c*). The third depth D3 may be substantially greater than the second depth D2. In some embodiments, the third depth D3 is in the range of from about 22.5 μm to about 32.5 μm. It should be noted that the arrangement of the lower fan-out tier 100*a* shown in FIG. 15 may also be applied to the semiconductor package 10*c* to improve issues of CTE mismatch and warpage and to facilitate heat dissipation.

Based on the above discussions, it can be seen that the present disclosure offers various advantages. It is understood, however, that not all advantages are necessarily discussed herein, and other embodiments may offer different advantages, and that no particular advantage is required for all embodiments.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

In accordance with some embodiments of the disclosure, a semiconductor package includes a lower encapsulated semiconductor device, a lower redistribution structure, an upper encapsulated semiconductor device, and an upper redistribution structure. The lower redistribution structure is disposed over and electrically connected to the lower encapsulated semiconductor device. The upper encapsulated semiconductor device is disposed over the lower encapsulated semiconductor device and includes a sensor die having a pad and a sensing region, an upper encapsulating material at least laterally encapsulating the sensor die, and an upper conductive via extending through the upper encapsulating material and connected to the lower redistribution structure. The upper redistribution structure is disposed over the upper encapsulated semiconductor device. The upper redistribution structure covers the pad of the sensor die and has an opening located on the sensing region of the sensor die.

In accordance with some embodiments of the disclosure, a semiconductor package includes a lower encapsulated semiconductor device, a lower redistribution structure, an upper encapsulated semiconductor device, and an upper redistribution structure. The lower encapsulated semiconductor device includes a semiconductor die set, a lower encapsulating material at least laterally encapsulating the semiconductor die set, and an lower conductive via extending through the lower encapsulating material. The lower redistribution structure is disposed over and connected to the lower encapsulated semiconductor device. The upper encapsulated semiconductor device is disposed over the lower encapsulated semiconductor device and includes a sensor die having a sensing region, an upper encapsulating material at least laterally encapsulating the sensor die, and an upper conductive via extending through the upper encapsulating material. The upper redistribution structure is disposed over the upper encapsulated semiconductor device and connected to the upper conductive via and the sensor die, wherein the upper redistribution structure revealing the sensing region of the sensor die.

In accordance with some embodiments of the disclosure, a manufacturing method of a semiconductor package includes the following steps. A semiconductor die set is placed adjacent to a lower conductive via. The semiconductor die set and the lower conductive via are at least laterally encapsulated with a lower encapsulating material to form a lower encapsulated semiconductor device. A lower redistribution structure is formed over the lower encapsulated semiconductor device. A sensor die is placed adjacent to an upper conductive via, wherein the sensor die has a pad and a sensing region. The sensor die and the upper conductive via are encapsulated with an upper encapsulating material to form an upper encapsulated semiconductor device. An upper redistribution structure is formed over the upper encapsulated semiconductor device, wherein the upper redistribution structure is connected to the pad and reveals the sensing region of the sensor die.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor package, comprising:

a base layer comprising a dielectric layer and a die attach region;

a lower encapsulated semiconductor device mounted on the base layer, wherein the lower encapsulated semiconductor device comprising a carrier attached to the base layer through a first adhesive, a first semiconductor die attached to the carrier through a second adhesive, and a plurality of second semiconductor dies disposed around the carrier, wherein the carrier is electrically insulated from the first semiconductor die and the plurality of second semiconductor dies, wherein a bottom surface of the carrier is coplanar with each of bottom surfaces of the plurality of second semiconductor dies, an upper surface of the first semiconductor die is coplanar with a plurality of upper surfaces of the plurality of second semiconductor dies;

a lower redistribution structure disposed over and electrically connected to the lower encapsulated semiconductor device;

an upper encapsulated semiconductor device disposed over the lower encapsulated semiconductor device and comprising a die having a pad and a sensing region, and an upper encapsulating material at least laterally encapsulating the die, wherein the die overlaps with the first semiconductor die and the plurality of second semiconductor dies from a top view; and an upper redistribution structure disposed over the upper encapsulated semiconductor device, the upper redistribution structure covering the pad of the die and having an opening located on the sensing region of the die.

2. The semiconductor package as claimed in claim 1, wherein the lower encapsulated semiconductor device comprises a lower encapsulating material at least lateral encapsulating the first semiconductor die and the plurality of second semiconductor dies, and a lower conductive via extending through the lower encapsulating material and connected to the lower redistribution structure.

3. The semiconductor package as claimed in claim 2, wherein the first semiconductor die and the plurality of second semiconductor dies disposed in a side by side manner and comprise an application specific integrated circuit (ASIC), a digital signal processor (DSP), a dynamic random access memory (DRAM), a power management integrated circuit (PMIC), a logic die, a dummy die, or any combination thereof.

4. The semiconductor package as claimed in claim 2, wherein the lower conductive via is disposed between the first semiconductor die and one of the plurality of second semiconductor dies.

5. The semiconductor package as claimed in claim 1, wherein a material of the carrier comprises ceramic or silicon.

6. The semiconductor package as claimed in claim 1, wherein the die is a sensor die, comprising:

a semiconductor substrate; and a passivation layer disposed on the semiconductor substrate, and a topmost surface of the passivation layer being above a topmost surface of the upper encapsulating material.

7. The semiconductor package as claimed in claim 1, wherein the die is a sensor die, comprising:

a semiconductor substrate; and a passivation layer disposed on the semiconductor substrate, and a topmost surface of the passivation layer being below a topmost surface of the upper encapsulating material.

8. The semiconductor package as claimed in claim 1, wherein a width of the sensing region of the die and a width of the opening of the upper redistribution structure are the same.

9. The semiconductor package as claimed in claim 1, wherein a footprint of the carrier is greater than a footprint of the first semiconductor die.

10. The semiconductor package as claimed in claim 1, wherein the first adhesive and the second adhesive comprise epoxy, or die attach film.

11. A semiconductor package, comprising:

a base layer comprising a dielectric layer and a die attach region;

a lower encapsulated semiconductor device comprising a semiconductor die set mounted on the die attach region, a lower encapsulating material at least laterally encapsulating the semiconductor die set, wherein the semiconductor die set comprising a carrier and a plurality of second semiconductor dies attached to the base layer through an adhesive, and a first semiconductor die attached to and electrically insulated from the carrier, and a bottom surface of the carrier is coplanar with each of bottom surfaces of the plurality of second semiconductor dies, an upper surface of the first semiconductor die is coplanar with a plurality of upper surfaces of the plurality of second semiconductor dies;

an upper encapsulated semiconductor device disposed over the lower encapsulated semiconductor device and comprising a die having an open region, and an upper encapsulating material at least laterally encapsulating the die; and an upper redistribution structure disposed over the upper encapsulated semiconductor device and connected to the die, wherein the upper redistribution structure revealing the open region of the die.

12. The semiconductor package as claimed in claim 11, wherein the first semiconductor die and the plurality of second semiconductor dies are disposed in a side-by-side manner.

13. The semiconductor package as claimed in claim 11, wherein the die is a sensor die, the open region is a sensing region of the die, and the die comprises:

a semiconductor substrate; and a passivation layer disposed on the semiconductor substrate, and a topmost surface of the passivation layer being above a topmost surface of the upper encapsulating material.

14. The semiconductor package as claimed in claim 11, wherein the die is a sensor die, the open region is a sensing region of the die, and the die comprises:

a semiconductor substrate; and a passivation layer disposed on the semiconductor substrate, and a topmost surface of the passivation layer being below a topmost surface of the upper encapsulating material.

15. The semiconductor package as claimed in claim 11, wherein the lower encapsulated semiconductor device further comprises a lower conductive via extending through the lower encapsulating material, and the carrier, the plurality of second semiconductor dies, and the lower conductive via are disposed on a same plane.

16. A semiconductor package, comprising:

a base layer comprising a dielectric layer and a die attach region;

a lower encapsulated semiconductor device over the base layer, wherein the lower encapsulated semiconductor device comprising a carrier attached to and electrically insulated from the base layer, a first semiconductor die attached to and electrically insulated from the carrier through an adhesive, and a plurality of second semiconductor dies disposed beside the first semiconductor die, wherein a bottom surface of the carrier is coplanar with each of bottom surfaces of the plurality of second semiconductor dies, an upper surface of the first semiconductor die is coplanar with a plurality of upper surfaces of the plurality of second semiconductor dies;

a lower redistribution structure disposed over and electrically connected to the lower encapsulated semiconductor device;

an upper encapsulated semiconductor device disposed over the lower encapsulated semiconductor device and comprising a die having a sensing region; and an upper redistribution structure disposed over the upper encapsulated semiconductor device, wherein the upper redistribution structure electrically connected to the die and having a cutout region revealing the sensing region of the die.

17. The semiconductor package as claimed in claim 16, wherein the plurality of second semiconductor dies are attached to the base layer and electrically connected to the first semiconductor die, wherein the plurality of second semiconductor dies surrounds and electrically insulated from the carrier.

18. The semiconductor package as claimed in claim 17, wherein the lower encapsulated semiconductor device further comprises a lower encapsulating material encapsulating the carrier, the first semiconductor die, and the plurality of second semiconductor dies.

19. The semiconductor package as claimed in claim 16, wherein material of the adhesive comprises die attach film (DAF).

20. The semiconductor package as claimed in claim 16, wherein the carrier is made of a bulk of silicon, glass, or ceramic.

* * * * *